(12) United States Patent
Lopatin et al.

(10) Patent No.: US 7,799,182 B2
(45) Date of Patent: Sep. 21, 2010

(54) ELECTROPLATING ON ROLL-TO-ROLL FLEXIBLE SOLAR CELL SUBSTRATES

(75) Inventors: Sergey Lopatin, Morgan Hill, CA (US); David Eaglesham, Livermore, CA (US); Charles Gay, Westlake Village, CA (US)

(73) Assignee: Applied Materials, Inc., Santa Clara, CA (US)

( * ) Notice: Subject to any disclaimer, the term of this patent is extended or adjusted under 35 U.S.C. 154(b) by 928 days.

(21) Appl. No.: 11/566,200

(22) Filed: Dec. 1, 2006

(65) Prior Publication Data

US 2008/0128013 A1    Jun. 5, 2008

(51) Int. Cl.
C25D 17/00    (2006.01)

(52) U.S. Cl. .................. 204/224 R; 204/202; 204/206; 205/129; 205/130; 205/133

(58) Field of Classification Search .................. 205/118, 205/130, 134, 137, 138, 129, 133; 204/198, 204/202, 224 R
See application file for complete search history.

(56) References Cited

U.S. PATENT DOCUMENTS

| | | | |
|---|---|---|---|
| 3,362,893 A * | 1/1968 | Amaro et al. ................ 205/119 |
| 3,849,880 A | 11/1974 | Haynos | |
| 3,865,698 A * | 2/1975 | Kosowsky et al. .......... 205/118 |
| 4,240,880 A | 12/1980 | Tsuchibuchi et al. | |
| 4,436,558 A | 3/1984 | Russak | |
| 4,581,108 A | 4/1986 | Kapur et al. | |
| 4,617,420 A | 10/1986 | Dilts et al. | |
| 4,623,751 A | 11/1986 | Kishi et al. | |
| 4,666,567 A | 5/1987 | Loch | |
| 4,789,437 A | 12/1988 | Sing et al. | |
| 4,869,971 A | 9/1989 | Nee et al. | |
| 4,921,583 A * | 5/1990 | Sewell et al. ................ 205/129 |
| 5,057,163 A | 10/1991 | Barnett et al. | |

(Continued)

FOREIGN PATENT DOCUMENTS

GB    2 348 212 A    9/2000

OTHER PUBLICATIONS

PCT International Search Report and Written Opinion dated Apr. 9, 2009, International Application No. PCT/US07/85959.

(Continued)

*Primary Examiner*—Luan V Van
(74) *Attorney, Agent, or Firm*—Patterson & Sheridan, LLP

(57) ABSTRACT

Embodiments of the invention contemplate the formation of a low cost flexible solar cell using a novel electroplating method and apparatus to form a metal contact structure. The apparatus and methods described herein remove the need to perform one or more high temperature screen printing processes to form conductive features on the surface of a solar cell substrate. The resistance of interconnects formed in a solar cell device greatly affects the efficiency of the solar cell. Solar cell substrates that may benefit from the invention include flexible substrates may have an active region that contains organic material, single crystal silicon, multi-crystalline silicon, polycrystalline silicon, germanium, and gallium arsenide, cadmium telluride, cadmium sulfide, copper indium gallium selenide, copper indium selenide, gallilium indium phosphide, as well as heterojunction cells that are used to convert sunlight to electrical power. The flexible substrates may have a flexible base that is adapted to support the active region of the solar cell device.

10 Claims, 18 Drawing Sheets

U.S. PATENT DOCUMENTS

| | | | |
|---|---|---|---|
| 5,198,965 A | 3/1993 | Curtis et al. | |
| 5,209,817 A | 5/1993 | Ahmad et al. | |
| 5,277,786 A | 1/1994 | Kawakami | |
| 5,575,855 A | 11/1996 | Kanai et al. | |
| 5,588,994 A | 12/1996 | Bozler et al. | |
| 5,841,197 A | 11/1998 | Adamic et al. | |
| 5,897,368 A | 4/1999 | Cole, Jr. et al. | |
| 5,968,333 A | 10/1999 | Nogami et al. | |
| 5,972,192 A | 10/1999 | Dubin et al. | |
| 6,103,085 A | 8/2000 | Woo et al. | |
| 6,146,480 A * | 11/2000 | Centanni et al. | 156/151 |
| 6,197,181 B1 | 3/2001 | Chen | |
| 6,261,433 B1 | 7/2001 | Landau | |
| 6,294,822 B1 | 9/2001 | Nakata | |
| 6,297,155 B1 | 10/2001 | Simpson et al. | |
| 6,299,745 B1 | 10/2001 | Kumar et al. | |
| 6,391,166 B1 | 5/2002 | Wang | |
| 6,406,610 B1 | 6/2002 | Lowe | |
| 6,447,938 B1 | 9/2002 | Bianchi | |
| 6,559,479 B1 | 5/2003 | Ludemann | |
| 6,572,742 B1 | 6/2003 | Cohen | |
| 6,610,189 B2 | 8/2003 | Wang et al. | |
| 6,656,275 B2 * | 12/2003 | Iwamoto | 118/301 |
| 6,670,543 B2 | 12/2003 | Lohmeyer et al. | |
| 6,706,166 B2 | 3/2004 | Chou et al. | |
| 6,881,318 B2 | 4/2005 | Hey et al. | |
| 7,172,184 B2 | 2/2007 | Pavani et al. | |
| 7,339,110 B1 | 3/2008 | Mulligan et al. | |
| 7,388,147 B2 | 6/2008 | Mulligan et al. | |
| 2003/0192583 A1 | 10/2003 | Ryan | |
| 2003/0230337 A1 | 12/2003 | Gaudiana et al. | |
| 2004/0067324 A1 | 4/2004 | Lazarev et al. | |
| 2004/0074762 A1 | 4/2004 | Keigler et al. | |
| 2004/0118446 A1 | 6/2004 | Toyomura | |
| 2004/0198187 A1 | 10/2004 | Tolles | |
| 2004/0200520 A1 | 10/2004 | Mulligan et al. | |
| 2005/0016862 A1 * | 1/2005 | Sano et al. | 205/305 |
| 2005/0061665 A1 | 3/2005 | Pavani et al. | |
| 2005/0103377 A1 | 5/2005 | Saneyuki et al. | |
| 2005/0121326 A1 | 6/2005 | Klocke et al. | |
| 2005/0199489 A1 | 9/2005 | Stevens et al. | |
| 2005/0272263 A1 | 12/2005 | Brabec et al. | |
| 2006/0033678 A1 | 2/2006 | Lubomirsky et al. | |
| 2006/0062897 A1 | 3/2006 | Gu et al. | |
| 2006/0174935 A1 | 8/2006 | Sawada et al. | |
| 2006/0185714 A1 | 8/2006 | Nam et al. | |
| 2006/0185716 A1 | 8/2006 | Murozono et al. | |
| 2006/0207885 A1 | 9/2006 | Basol | |
| 2006/0217049 A1 | 9/2006 | Li et al. | |
| 2006/0219565 A1 | 10/2006 | Preusse et al. | |
| 2006/0223300 A1 | 10/2006 | Simka et al. | |
| 2008/0092947 A1 | 4/2008 | Lopatin et al. | |
| 2008/0121276 A1 | 5/2008 | Lopatin et al. | |
| 2008/0128013 A1 | 6/2008 | Lopatin et al. | |
| 2008/0128019 A1 | 6/2008 | Lopatin et al. | |
| 2008/0128268 A1 * | 6/2008 | Lopatin et al. | 204/192.1 |
| 2008/0132082 A1 * | 6/2008 | Lopatin et al. | 438/765 |

OTHER PUBLICATIONS

Popov, et al., "The Relationship Between The Effective Current Density And The Effective Overpotential In Copper Deposition By The Pulsating Potential", Institute of Chemistry, Technology and Metallurgy, Beograd, Yugoslavia, Journal Of Applied Electrochemistry 4 (1974), pp. 267-273.

Puippe, et al., "The Morphology Of Pulse-Plated Deposits", Plating And Surface Finishing, Jun. 1980, pp. 68-72, (Based on a presentation made at the AES International Symposium on Pulse Plating, Apr. 19-20, 1979).

Kray, et al "High-Efficiency Emitter-Wrap-Through Cells", 17th EU-PVSEC Munich (2001), Paper OA8.1, pp. 1-4.

Eager, et al. "Environmentally Friendly Processes in the Manufacture of Saturn Solar Cells", 2002 IEEE, pp. 62-65.

Domeier, et al. "Microscreen-based Replication of Electroforming Micromolds", Microsystem Technologies 8 (2002), pp. 78-82.

Fredenberg, et al. "Recent Progress in the Development of ECPR (ElectroChemical Pattern Replication) Metal Printing for Microelectronics", 208th ECS Meeting, Oct. 16-21, 2005, Los Angeles, California, Abstract #682.

Weeber, et al. "How to Achieve 17% Cell Efficiencies on Large Back-Contacted Mc-Si Solar Cells", 2006 IEEE 4th World Conference on Photovoltaic Energy Conversion, May 7-12, 2006, Hawaii, pp. 1-4.

Granek, et al. "A Systematic Approach to Reduce Process-Induced Shunts in Back-Contacted Mc-Si Solar Cells", 2006 IEEEE 4th World Conference on Photovoltaic Energy Conversion, May 7-12, 2006 Hawaii, pp. 1-4.

Lee, et al. "Correlation of Stress and Texture Evolution During Self- and Thermal Annealing of Electroplated Cu Films", 2000 IEEE, pp. 114-116.

Lee, et al. "Evidence of Dislocation Loops as a Driving Force for Self-Annealing in Electroplated Cu Films", 2001 IEEE, pp. 236-238.

Lopatin, et al. "Electroless Cu and Barrier Layers for Sub-Half Micron Multilevel Interconnects", SPIE vol. 3214, pp. 21-32.

Eikelbloom, et al. "Conductive Adhesives for Low-Stress Interconnection of Thin Back-Contact Solar Cells", 29th IEEE Photovoltaic Specialists Conference, May 20-24, 2002, New Orleans, pp. 1-4, http://www.ecn.nl/docs/library/report/2002/rx02052.pdf.

Schubert, et al. "Flexible Solar Cells for Clothing", Materials Today, Jun. 2006, vol. 9 No. 6, pp. 42-50.

Rivkin, et al., "Direct Write Processing for Photovoltaic Cells", 12th Workshop on Crystalline Silicon Solar Cell Materials and Processes, NREL/BK-520-32717, Aug. 2000, pp. 223-226.

International Search Report. Sep. 19, 2008.

Prosecution History for U.S. Appl. No. 11/566,202.

Prosecution History for U.S. Appl. No. 11/566,205.

* cited by examiner

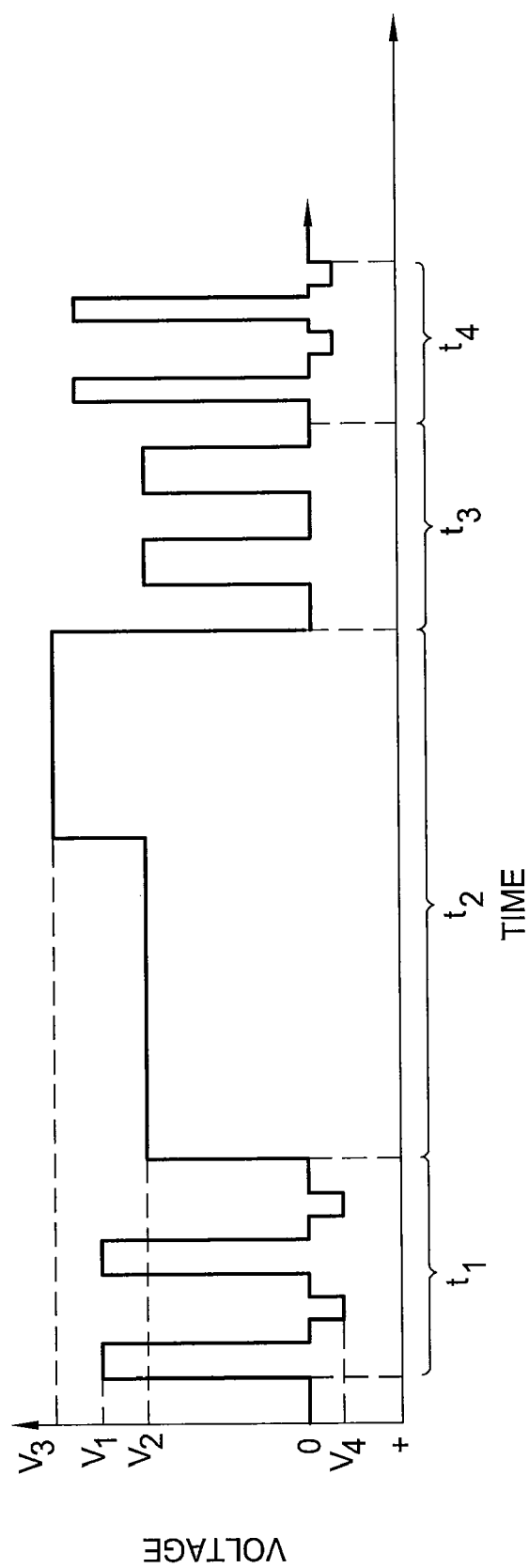

ELECTROPLATING ON ROLL-TO-ROLL FLEXIBLE SOLAR CELL SUBSTRATES

CROSS-REFERENCE TO RELATED APPLICATIONS

This application is related to the U.S. patent application entitled "High Aspect Ratio Anode And Apparatus For High-Speed Electroplating On A Solar Cell Substrate" by Sergey Lopatin et al. [Ser. No. 11/566,202], filed Dec. 1, 2006, the U.S. patent application entitled "Method Of Metallizing A Solar Cell Substrate" by Sergey Lopatin et al. [Ser. No. 11/566,201], filed Dec. 1, 2006, and the U.S. patent application entitled "Precision Printing Electroplating Through Plating Mask On A Solar Cell Substrate" by Sergey Lopatin et al. [Ser. No. 11/566,205], filed Dec. 1, 2006, which are all herein incorporated by reference.

BACKGROUND OF THE INVENTION

1. Field of the Invention

Embodiments of the present invention generally relate to the fabrication of photovoltaic cells and particularly to the formation of layers on a substrate by use of an electrochemical deposition process.

2. Description of the Related Art

Solar cells are photovoltaic devices that convert sunlight directly into electrical power. The most common solar cell material is silicon, which is in the form of single or polycrystalline wafers. Because the amortized cost of forming a silicon-based solar cells to generate electricity is higher than the cost of generating electricity using traditional methods, there has been an effort to reduce the cost to form solar cells.

FIGS. 1A and 1B schematically depicts a standard silicon solar cell 100 fabricated on a wafer 110. The wafer 110 includes a p-type base region 101, an n-type emitter region 102, and a p-n junction region 103 disposed therebetween. An n-type region, or n-type semiconductor, is formed by doping the semiconductor with certain types of elements (e.g., phosphorus (P), arsenic (As), or antimony (Sb)) in order to increase the number of negative charge carriers, i.e., electrons. Similarly, a p-type region, or p-type semiconductor, is formed by the addition of trivalent atoms to the crystal lattice, resulting in a missing electron from one of the four covalent bonds normal for the silicon lattice. Thus the dopant atom can accept an electron from a neighboring atoms' covalent bond to complete the fourth bond. The dopant atom accepts an electron, causing the loss of half of one bond from the neighboring atom and resulting in the formation of a "hole".

When light falls on the solar cell, energy from the incident photons generates electron-hole pairs on both sides of the p-n junction region 103. Electrons diffuse across the p-n junction to a lower energy level and holes diffuse in the opposite direction, creating a negative charge on the emitter and a corresponding positive charge builds up in the base. When an electrical circuit is made between the emitter and the base and the p-n junction is exposed to certain wavelengths of light, a current will flow. The electrical current generated by the semiconductor when illuminated flows through contacts disposed on the frontside 120, i.e. the light-receiving side, and the backside 121 of the solar cell 100. The top contact structure, as shown in FIG. 1A, is generally configured as widely-spaced thin metal lines, or fingers 104, that supply current to a larger bus bar 105. The back contact 106 is generally not constrained to be formed in multiple thin metal lines, since it does not prevent incident light from striking solar cell 100. Solar cell 100 is generally covered with a thin layer of dielectric material, such as $Si_3N_4$, to act as an anti-reflection coating 111, or ARC, to minimize light reflection from the top surface of solar cell 100.

The fingers 104 are in contact with the substrate are adapted to form an ohmic connection with doped region (e.g., n-type emitter region 102). An ohmic contact is a region on a semiconductor device that has been prepared so that the current-voltage (I-V) curve of the device is linear and symmetric, i.e., there is no high resistance interface between the doped silicon region of the semiconductor device and the metal contact. Low-resistance, stable contacts are critical for the performance of the solar cell and reliability of the circuits formed in the solar cell fabrication process. Hence, after the fingers 104 have been formed on the light-receiving surface and on the backside, an annealing process of suitable temperature and duration is typically performed in order to produce the necessary low resistance metal silicide at the contact/semiconductor interface. A backside contact completes the electrical circuit required for solar cell to produce a current by forming an ohmic contact with p-type base region of the substrate.

Widening the current carrying metal lines (e.g., fingers 104) on the light-receiving surface of the solar cell lowers the resistance losses, but increases the shadowing losses due to the reduced effective surface area of the light-receiving surface. Therefore, maximizing solar cell efficiency requires balancing these opposing design constraints. FIG. 1C illustrates a plan view of one example of a top contact structure 135 for a conventional pin-up module (PUM) cell, wherein the finger width and geometry have been optimized to maximize cell efficiency for the cell. In this configuration, a top contact structure 135 for a PUM cell is configured as a grid electrode 138, which consists of a plurality of various width finger segments 135A. The width of a particular finger segment 135A is selected as a function of the current to be carried by that finger segment 135A. In addition, finger segments 135A are configured to branch as necessary to maintain finger spacing as a function of finger width. This minimizes resistance losses as well as shadowing by finger segments 135A.

Traditionally, the current carrying metal lines, or conductors, are fabricated using a screen printing process in which a silver-containing paste is deposited in a desired pattern on a substrate surface and then annealed. However, there are several issues with this manufacturing method. First, the thin fingers of the conductors, when formed by the screen printing process, may be discontinuous since the fingers formed using a metal paste do not always agglomerate into a continuous interconnecting line during the annealing process. Second, porosity present in the fingers formed during the agglomeration process results in greater resistive losses. Third, electrical shunts may be formed by diffusion of the metal (e.g., silver) from the contact into the p-type base region or on the surface of the substrate backside. Shunts on the substrate backside are caused by poor definition of backside contacts such as waviness, and/or metal residue. Fourth, due to the relatively thin substrate thicknesses commonly used in solar cell applications, such as 200 micrometers and less, the act of screen printing the metal paste on the substrate surface can cause physical damage to the substrate. Lastly, silver-based paste is a relatively expensive material for forming conductive components of a solar cell.

One issue with the current method of forming metal interconnects using a screen printing process that utilizes a metal particle containing paste is that the process of forming the patterned features requires high temperature post-processing steps to densify the formed features and form a good electrical contact with the substrate surface. Due to the need to perform a high temperature sintering process the formed interconnect lines will have a high extrinsic stress created by the difference in thermal expansion of the substrate material and the metal lines. A high extrinsic stress, or even intrinsic stress, formed in the metal interconnect lines is an issue, since it can cause breakage of the formed metallized features, warping of the thin solar cell substrate, and/or delamination of the metallized features from the surface of the solar cell substrate. High temperature processes also limit the types of materials that can be used to form a solar cell due to the breakdown of certain materials at the high sintering temperatures. Also, screen printing processes also tend to be non-uniform, unreliable and often unrepeatable. Therefore, there is a need to form a low stress interconnect line that forms a strong bond to the surface of the substrate.

Another approach to forming very thin, robust current carrying metal lines on the surface of a solar cell substrate involves cutting grooves in the surface of the substrate with a laser. The grooves are subsequently filled by an electroless plating method. However the laser-cut grooves are a source of macro- and micro-defects. The laser-cut edge is not well defined, causing waviness on the finger edges, and the heat of the laser introduces defects into the silicon.

Other traditional methods of forming the metal lines (e.g., fingers 104) in a metal interconnect structure are performed by use of expensive multistep processes to form a desired pattern of metallized features on the substrate surface. These processes can include deposition of a blanket metal film, performing a masking step, such as a lithography type steps, to form a desired pattern and then performing electroless or electroplating processes to build up the thickness of the formed metal lines. In one example, the process of forming metal line includes the steps of: 1) depositing a blanket metal layer over the surface of the substrate, 2) depositing a resist layer over the metal layer, 3) exposing portions of the resist layer to some form of radiation, 4) developing the resist, 5) electroplating the metal layer in the exposed portions of the blanket metal, 6) removing the resist layer from the surface of the substrate, and then 7) etching away the blanket metal layer between the plated areas on the substrate surface. In another example, known as the ink jet printing method, the process of forming metal line includes the steps of: 1) depositing a blanket metal layer over the surface of the substrate, 2) depositing an ink layer over various portions of the blanket metal layer, 3) drying the ink layer, 4) electroplating the metal layer in the exposed portions of the blanket metal, 5) removing the ink layer from the surface of the substrate, and then 6) etching away the blanket metal layer between the plated areas on the substrate surface. These conventional processes require a number of processing steps that make the cost to produce the substrate fairly expensive and increase the chance of the substrate being misprocessed, thus causing substrate scrap and waste.

In recent years the solar cell industry has been working ways to form a low cost flexible solar cell for use in varied electrical applications, such as computers, smart cards, curved building surfaces, clothing, retractable satellite solar arrays, portable electronic devices, and cell phones. Flexible solar cells are attractive since they can be formed inexpensively using a high speed production processes, such as roll-to-roll manufacturing methods. Flexible substrate can be constructed from polymeric materials, such as a polyimide (e.g., KAPTON™ by DuPont Corporation), polyethyleneterephthalate (PET), polyacrylates, polycarbonate, silicone, epoxy resins, silicone-functionalized epoxy resins, polyester (e.g., MYLAR™ by E.I. du Pont de Nemours & Co.), APICAL AV manufactured by Kanegaftigi Chemical Industry Company, UPILEX manufactured by UBE Industries, Ltd.; polyethersulfones (PES) manufactured by Sumitomo, a polyetherimide (e.g., ULTEM by General Electric Company), and polyethylenenaphthalene (PEN). In some cases the substrate can be constructed from a metal foil, such as stainless steel that has an insulating coating disposed thereon. Alternately, flexible substrate can be constructed from a relatively thin glass that is reinforced with a polymeric coating. In most low cost applications flexible substrates use a material that cannot be to brought to temperatures exceeding 250° C. and thus the metallizing process must be performed at temperatures well below these temperatures. Also, typical conventional deposition processes will not allow a conductive layer to selectively formed on the surface of the substrate. Therefore, there is a need for a low cost process that can rapidly and selectively form a conductive on the surface of a flexible substrate. Also, there is a need for a low cost method of forming a contact structure for solar cells that can be rapidly formed the have an low cost of ownership (CoO).

SUMMARY OF THE INVENTION

Embodiments of the present invention generally provide an apparatus for forming a metal layer on a flexible solar cell substrate, comprising an electrode that is in electrical communication with a power supply, a flexible substrate assembly comprising a support that is adapted to retain a portion of a flexible substrate, and an actuator that is connected to the support and is adapted to position a metallized surface of the flexible substrate in a desired position proximate to the electrode, a contact that is in communication with the power supply, and a thrust plate that is adapted to urge the metallized surface of the flexible substrate against the contact.

Embodiments of the present invention may further provide an apparatus for forming a metal layer on a solar cell substrate, comprising a first processing chamber that is adapted to deposit a first metal layer on a surface of a flexible substrate, a second processing chamber that is adapted to form a second metal layer on the seed layer, wherein the second processing chamber comprises an electrical contact that is in communication with a power supply, a thrust plate that is adapted to urge the first metal layer formed on the flexible substrate against the contact, and an electrode that is in electrical communication with the power supply, wherein the power supply is adapted to bias the electrode relative to the electrical contact, and a flexible substrate assembly comprising a support that is adapted to retain a portion of the flexible substrate, and an actuator that is connected to the support and is adapted to position a portion of the flexible substrate in a desired position in the first and second processing chambers.

Embodiments of the present invention may further provide a method of forming a metal layer on a flexible solar cell substrate, comprising forming a seed layer on a portion of a flexible substrate, disposing a masking plate having a plurality of apertures formed therein over a portion of the seed layer formed on the flexible substrate, contacting the seed layer with one or more electrical contacts, and forming a first metal layer over the seed layer by immersing the seed layer and an electrode in a first electrolyte and biasing the electrical contacts relative to the electrode using a power supply, wherein the first metal layer is formed within the areas exposed by apertures formed in the masking plate.

Embodiments of the present invention may further provide an apparatus for forming a metal layer on a solar cell substrate, comprising a processing chamber that is adapted to deposit a first metal layer on a surface of a first flexible substrate, a first flexible substrate support assembly comprising, a first support that is adapted to retain a portion of a first flexible substrate, and an first actuator that is connected to the first support and is adapted to position a portion of the first flexible substrate in a desired position in the processing chamber, and a second flexible substrate support assembly comprising a second support that is adapted to retain a portion of a second flexible substrate, and an second actuator that is connected to the second support and is adapted to position a portion of the second flexible substrate in a desired position in the processing chamber, and a third actuator that is adapted to urge a portion of the first flexible substrate against a portion of the second flexible substrate so that a conductive region formed on the first flexible substrate can form an electrical connection to a conductive region formed on the second flexible substrate.

Embodiments of the present invention may further provide a method of forming a solar cell array, comprising positioning a flexible substrate that has an first n-type region and a first p-type region that comprise elements of a first solar cell device and a second n-type region and a second p-type region that comprise elements of a second solar cell device in a solar cell processing system, forming a conductive region on a first flexible substrate within the solar cell processing system, wherein the forming the conductive region on the first flexible substrate comprises forming a first metal layer on a portion of the first n-type region, forming a second metal layer on a portion of the first p-type region, forming a third metal layer on a portion of the second n-type region, and forming a fourth metal layer on a portion of the second p-type region, forming a conductive layer on a portion of a second substrate, and forming an electrical connection between the conductive layer formed on the second substrate and at least two of the conductive regions selected from the group consisting of the first metal layer, second metal layer, the third metal layer and the fourth metal layer by urging the conductive layer and the at least two conductive regions together.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 5 illustrates a waveform that can be used to electrochemically plated a metal layer on a surface of a substrate according to one embodiment described herein.

For clarity, identical reference numerals have been used, where applicable, to designate identical elements that are common between figures. It is contemplated that features of one embodiment may be incorporated in other embodiments without further recitation.

DETAILED DESCRIPTION

Embodiments of the invention contemplate the formation of a low cost flexible solar cell using a novel electroplating method and apparatus to form a metal contact structure. The apparatus and methods described herein remove the need to perform the often costly processing steps of performing a mask preparation, formation and removal steps, such as lithographic steps and inkjet printing steps, to form a contact structure. Solar cell substrates that may benefit from the invention include flexible substrates may have an active region that contains organic material, single crystal silicon, multi-crystalline silicon, polycrystalline silicon, germanium (Ge), and gallium arsenide (GaAs), cadmium telluride (CdTe), cadmium sulfide (CdS), copper indium gallium selenide (CIGS), copper indium selenide (CuInSe$_2$), gallium indium phosphide (GaInP$_2$), as well as heterojunction cells, such as GaInP/GaAs/Ge or ZnSe/GaAs/Ge substrates, that are used to convert sunlight to electrical power. The flexible substrates may have a flexible base 301 that is adapted to support the active region of the solar cell device. The flexible base 301 may be formed from polymeric materials (e.g., polyimide, PET, PEN, silicones, epoxy resin, polyesters), metal foils, thin glass, silicon or other similar materials. Typically, the flexible substrate may be between about 30 micrometers (μm) and about 1 cm thick.

The resistance of interconnects formed in a solar cell device greatly affects the efficiency of the solar cell. It is thus desirable to form a solar cell device that has a low resistance connection that is reliable and cost effective. As noted above, silver (Ag) interconnecting lines formed from a silver paste is one of the currently the preferred interconnecting method. However, while silver has a lower resistivity (e.g., $1.59 \times 10^{-8}$ ohm-m) than other common metals such as copper (e.g., $1.67 \times 10^{-8}$ ohm-m) and aluminum (e.g., $2.82 \times 10^{-8}$ ohm-m) it costs orders of magnitude more than these other common metals. Therefore, one or more embodiments of the invention described herein are adapted to form a low cost and reliable interconnecting layer using an electrochemical plating process containing a common metal, such as copper. However, generally the electroplated portions of the interconnecting layer may contain a substantially pure metal or a metal alloy layer containing copper (Cu), silver (Ag), gold (Au), tin (Sn), cobalt (Co), rhenium (Rh), nickel (Ni), zinc (Zn), lead (Pb), palladium (Pd), and/or aluminum (Al). Preferably, the electroplated portion of the interconnect layer contains substantially pure copper or a copper alloy.

Figure 2A:
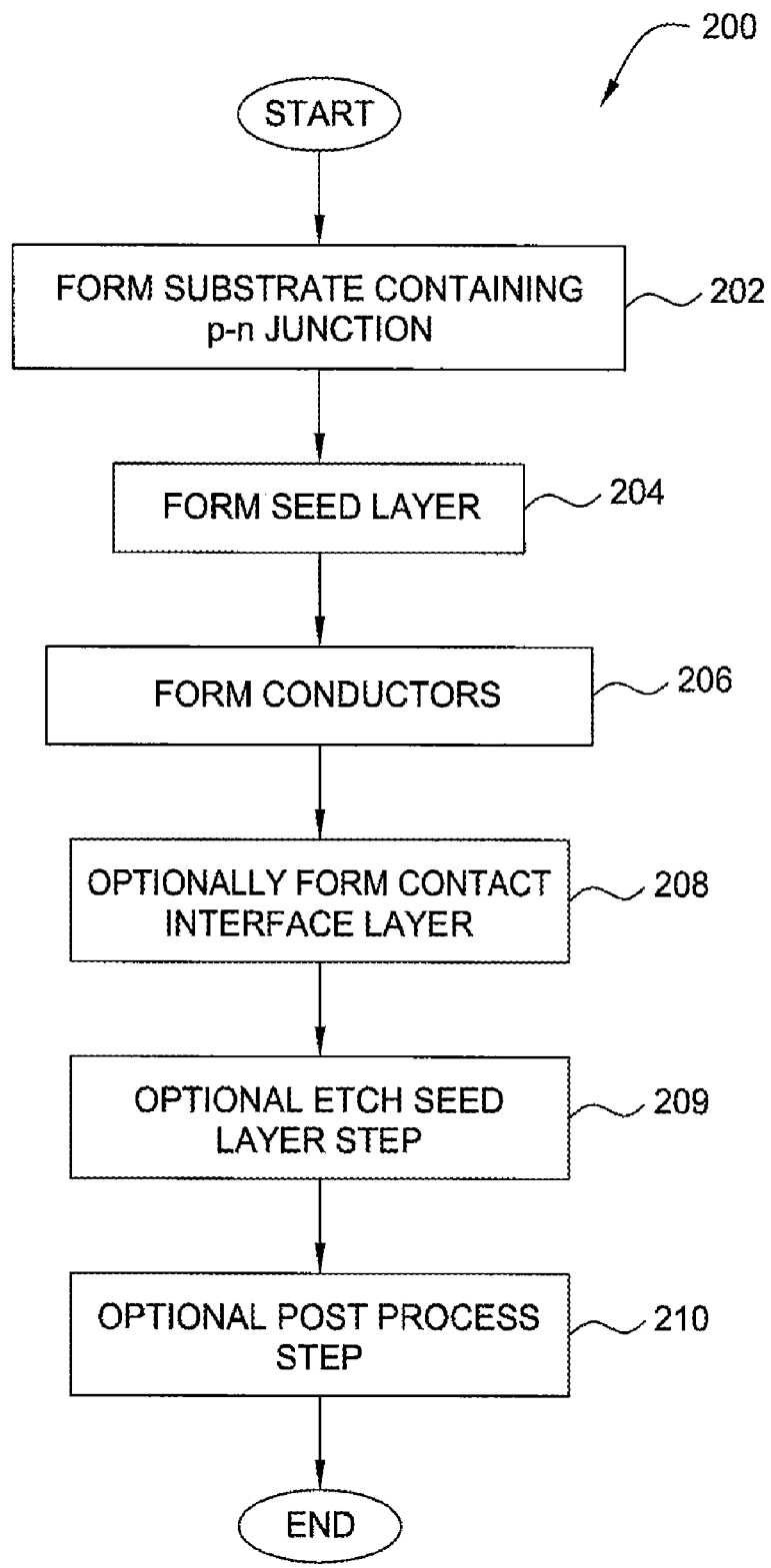
FIG. 2A illustrates a solar cell process sequence according to one embodiment described herein.

FIG. 2A illustrates a series of method steps 200 that are used to form metal contact structures on a flexible solar cell device using the apparatus described herein. The processes described below may be used to form a solar cell having interconnects formed using any conventional device interconnection style or other technique. Thus while the embodiments described herein are discussed in conjunction with the formation of a device that has the electrical contacts on the same side of the substrate this interconnect configuration is not intended to be limiting as to the scope of the invention, since other device configurations, such as a PUM, may be formed using the apparatus and methods described herein without varying from the basic scope of the invention.

FIGS. 3A-3G illustrate the various states of a portion of the metallized flexible substrate 320 after each step of method steps 200 has been performed. The method steps 200 start with step 202 in which a backside metal layer 302 is formed on the flexible base 301 by a metallization process performed in step 214 (FIG. 2B), which is described below. In general, the backside metal layer 302 may contain a conductive material such as a pure metal, metal alloy or other conductive material. In one embodiment, the backside metal layer 302 contains one or more metals selected from the group consisting of nickel (Ni), cobalt (Co), titanium (Ti), tantalum (Ta), rhenium (Rh), molybdenum (Mo), tungsten (W), and ruthenium (Ru). For example, the backside metal layer 302 may contain one or more metals or metal alloys selected from the group consisting of nickel (Ni), cobalt (Co), titanium (Ti), their silicides, titanium tungsten (TiW), titanium nitride (TiN), tantalum (Ta), tantalum nitride (TaN), molybdenum (Mo), tungsten (W), tungsten silicide (WSi), molybdenum silicide (MoSi), and ruthenium (Ru). In one embodiment, the thickness of the backside metal layer 302 may be between about 1000 angstroms (Å) and about 20 µm. In one embodiment, the backside metal layer 302 may be deposited on the flexible base 301 using an electroless deposition process, a conventional evaporation type deposition process, or a conventional physical vapor deposition (PVD) process. In some cases a conventional chemical vapor deposition (CVD) process may be used. In one embodiment, the backside metal layer 302 is an indium-tin-oxide (ITO) or a transparent conductive oxide (TCO), such as a zinc oxide ($Zn_xO_y$), tin oxide ($Sn_xO_y$), antimony oxide ($Sb_xO_y$), titanium oxide ($Ti_xO_y$), aluminum oxide ($Al_2O_3$), or combination thereof.

In one embodiment, the backside metal layer 302 consists of at least two layers of metal that are used to promote adhesion to the surface of the flexible base 301 and/or improve the backside metal layer's mechanical or electrical properties. In one example, the backside metal layer 302 contains a first metal layer that is deposited on the substrate surface(s) and a second metal layer that contains copper. In this configuration the second layer is deposited over the first metal layer so that it can act as a seed on which a subsequent electrochemically deposited layer can be formed. In this case the first layer may contain one or more metals or metal alloys selected from the group consisting of nickel (Ni), cobalt (Co), titanium (Ti), titanium nitride (TiN), titanium tungsten (TiW), tantalum (Ta), tantalum nitride (TaN), molybdenum (Mo), tungsten (W), and ruthenium (Ru) that is deposited using an electroless deposition process, a conventional physical vapor deposition (PVD) process or a conventional chemical vapor deposition (CVD) process, and a second copper containing layer may be a substantially pure layer or an alloy that contains one or more metals selected from the group consisting of cobalt (Co), tin (Sn), silver (Ag), gold (Au), aluminum (Al), and nickel (Ni). In one embodiment, the second layer may be deposited using an electroless deposition process, a conventional physical vapor deposition (PVD) process or a conventional chemical vapor deposition (CVD) process. In one embodiment, the second layer is formed by use of an electrochemical deposition process, such as the processes discussed below.

In step 203, a layer 303 (FIG. 3B), which is the active region of the solar device, is formed over the backside metal layer 302 using conventional solar cell and/or semiconductor fabrication techniques. The layer 303 may be formed from single crystal silicon, or polycrystalline silicon, cadmium telluride (CdTe), cadmium sulfide (CdS), copper indium gallium selenide (CIGS), copper indium selenide ($CuInSe_2$), gallium arsenide (GaAs), germanium (Ge), gallilium indium phosphide ($GaInP_2$), or other similar materials. The layer 303 may contain an organic solar cell material that can assist in the conversion of sun light into energy. In one example, a p-type silicon region (not shown) is formed disposed over an n-type doped silicon region that is formed using two separate deposition steps. The n-type region can be formed using conventional chemical vapor deposition (CVD) process, molecular beam epitaxy (MBE), or other similar doping or film deposition techniques. An optional arc layer 304, or antireflective coating (e.g., silicon nitride (SiN)), can be formed on the light-receiving surface 332 using a PVD or CVD technique.

In step 204, an interconnect structure may be formed in the layer 303 so that conductors 325 can be made to the desired regions of the solar cell device. In one embodiment, an aperture 310 is formed in the arc layer 304 so that a metal line can directly contact the top surface of the layer 303 and an aperture 311 is formed through the arc layer 304 and layer 303 to expose the backside metal layer 302. The apertures 310, 311 may be formed using a conventional lithography and wet or dry etching processing techniques or by use of conventional laser drilling processes. It should be noted that the order of forming the interconnect structure (e.g., steps 202-208) in the process sequence 200 is not intended to be limiting as to the scope of the invention described herein.

Metallization Steps

In the next step, step 206, which is discussed below in conjunction with FIGS. 2B and 3E-3G, one or more conductors 325 are formed over desired regions of the substrate surface. In the first processing step 214 of step 206, a seed layer 305 is formed over the layer 303 using an electroless deposition process, a conventional physical vapor deposition (PVD) process or a conventional chemical vapor deposition (CVD) process. An example of an electroless deposition process that may be adapted to grow a seed layer 305 on the layer 303 is further described in the U.S. patent application Ser. No. 11/385,047 [APPM 9916.02], filed Mar. 20, 2006, U.S. patent application Ser. No. 11/385,043 [APPM 9916.04], filed Mar. 20, 2006, and U.S. patent application Ser. No. 11/385,041 [APPM 10659], filed Mar. 20, 2006, which are all incorporated by reference in their entirety. In another embodiment, the seed layer 305 may be selectively formed by use of an inkjet, rubber stamping, or any technique for the pattern wise deposition (i.e., printing) of a metal containing liquid or colloidal media on the surface of the substrate. After depositing the metal containing liquid or colloidal media on the surface of the substrate, it is generally desirable to perform a thermal post treatment to remove any solvent and promote adhesion of the metal to the substrate surface. An example of pattern wise deposition process that may be used to form a seed layer 305 on a region of a substrate is further described in the U.S. patent application Ser. No. 11/530,003 [APPM 10254], filed Sep. 7, 2006, which is incorporated by reference in its entirety.

Figure 3A:
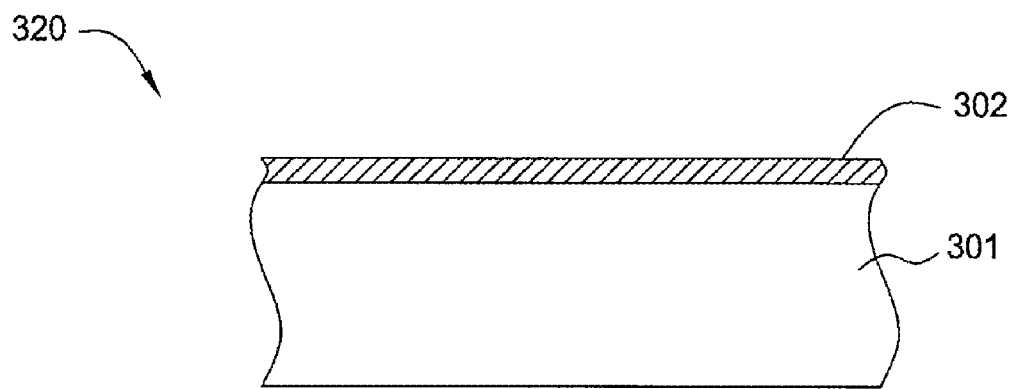
FIGS. 3A-3I illustrate schematic cross-sectional views of a solar cell during different stages of the process sequence described in FIGS. 2A-2B.
Figure 3B:
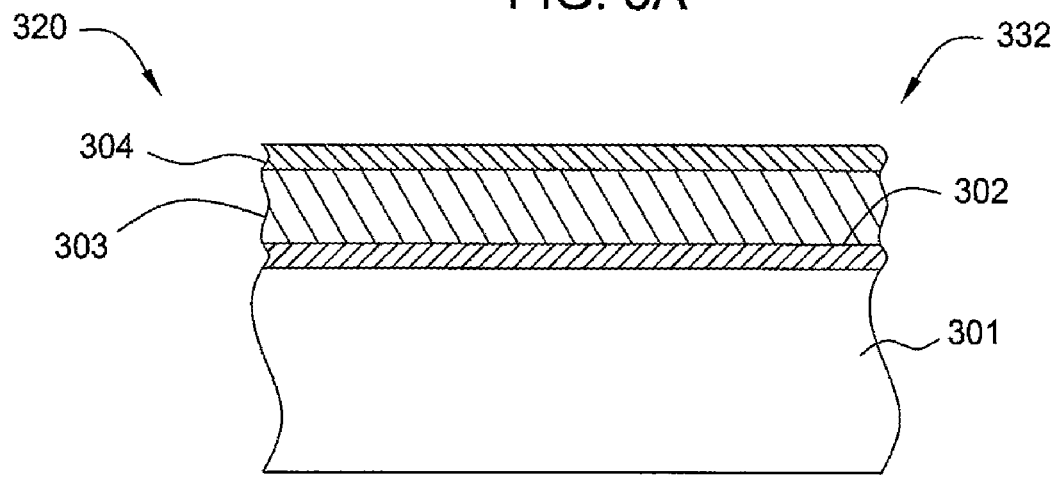
Figure 3C:
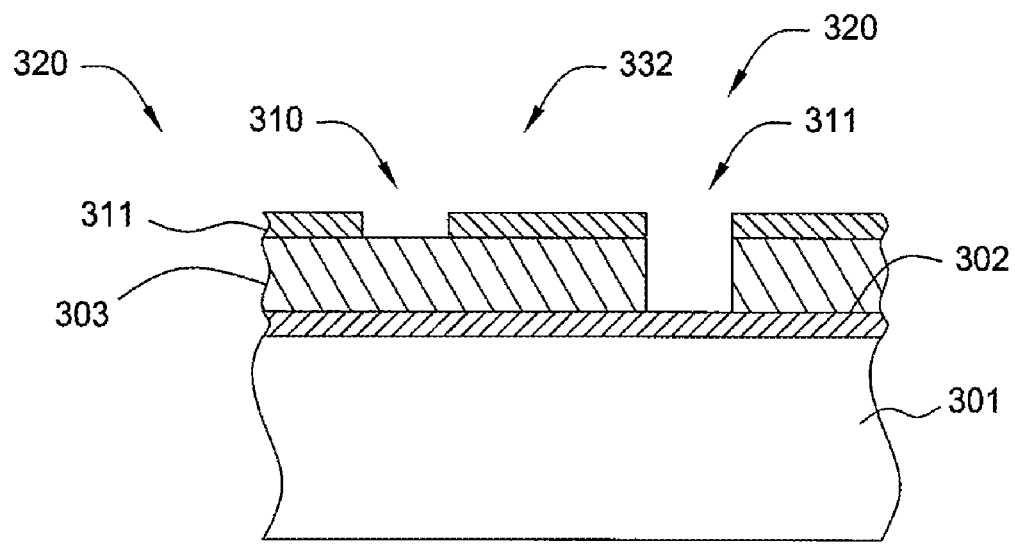
Figure 3D:
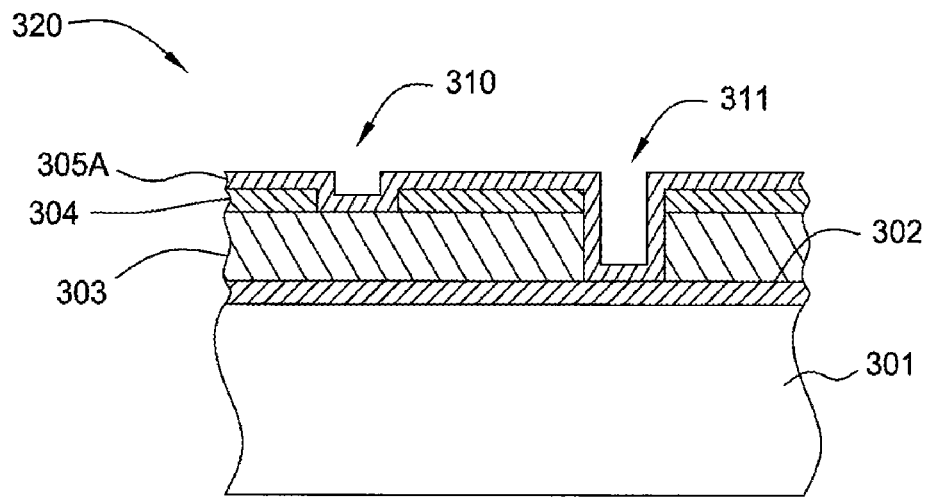
Figure 3E:
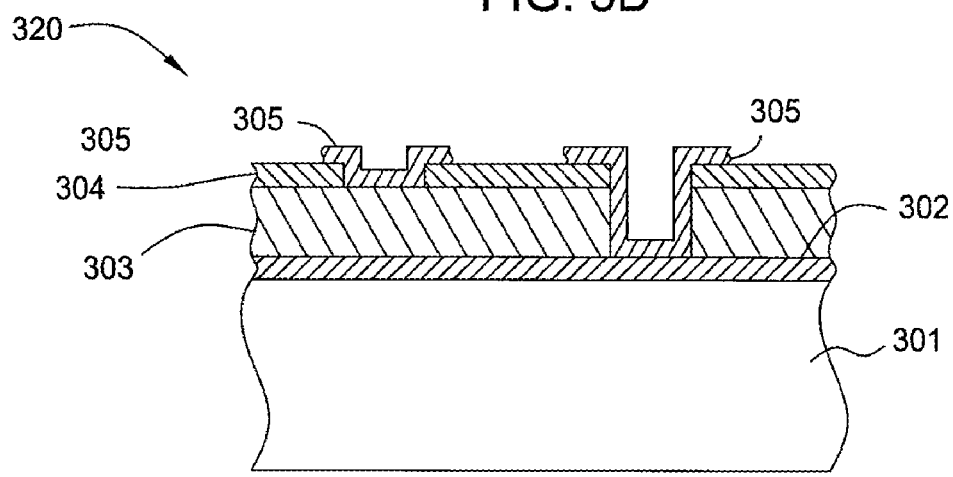

In one embodiment, as shown in FIGS. 3D and 3E, the seed layer 305 is formed from a blanket seed layer 305A (FIG. 3B), that is deposited over the complete surface of the substrate and then selective regions are removed using conventional masking and etching techniques to form the seed layer 305 (FIG. 3E) that has a desired pattern on the surface of the substrate. In general, a blanket seed layer 305A may be deposited using a physical vapor deposition (PVD), chemical vapor deposition (CVD), conventional evaporation deposition techniques (e.g., molecular beam epitaxy (MBE)), or atomic layer deposition (ALD) process.

In general, the seed layer 305 may contain a conductive material such as a pure metal, metal alloy or other conductive material. In one embodiment, the seed layer 305 contains one or more metals selected from the group consisting of nickel (Ni), cobalt (Co), titanium (Ti), tantalum (Ta), rhenium (Rh), molybdenum (Mo), tungsten (W), and ruthenium (Ru). It is desirable to select a deposition process and a metal that forms a good electrical contact, or ohmic contact, between the doped silicon region and the deposited seed layer 305. In one aspect, the seed layer 305 is selected so that it acts as a barrier to the diffusion of a metal in the subsequently formed conductor 325 during subsequent processing steps. For example, the seed layer 305 may contain one or more metals or metal alloys selected from the group consisting of nickel (Ni), cobalt (Co), titanium (Ti), their silicides, titanium tungsten (TiW), titanium nitride (TiN), tantalum (Ta), tantalum nitride (TaN), molybdenum (Mo), tungsten (W), tungsten silicide (WSi), molybdenum silicide (MoSi), and ruthenium (Ru). In one embodiment, the thickness of the seed layer 305 may be between about 100 Å and about 2000 Å. In another embodiment, for higher power applications the thickness of the seed layer 305 may be between about 2000 and about 5000 Å.

Figure 3F:
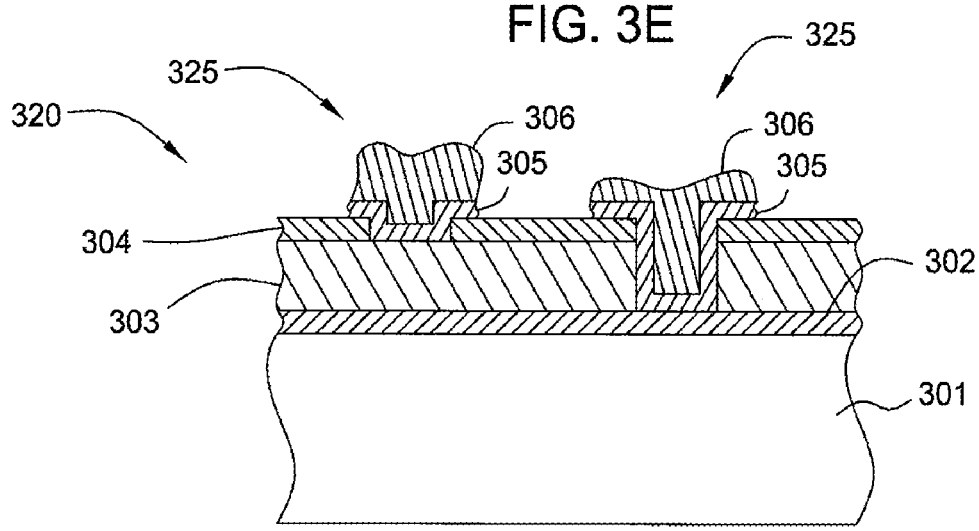

In one embodiment, the seed layer 305 consists of at least two layers of metal that are used to promote adhesion to the surface of the substrate, act as a diffusion barrier, and/or promote the growth of a subsequently deposited metal layer 306 contained within the conductor 325 (FIG. 3F). In one example, the seed layer 305 contains a first metal layer that is deposited on the substrate surface(s) and a second metal layer that contains copper. In this configuration the second layer is deposited over the first metal layer so that it can act as a seed on which an electrochemically deposited layer can be formed. In this case the first layer may contain one or more metals or metal alloys selected from the group consisting of nickel (Ni), cobalt (Co), titanium (Ti), titanium nitride (TiN), titanium tungsten (TiW), tantalum (Ta), tantalum nitride (TaN), molybdenum (Mo), tungsten (W), and ruthenium (Ru) that is deposited using an electroless deposition process, a conventional physical vapor deposition (PVD) process or a conventional chemical vapor deposition (CVD) process, and a second copper containing layer may be a substantially pure layer or an alloy that contains one or more metals selected from the group consisting of cobalt (Co), tin (Sn), silver (Ag), gold (Au), aluminum (Al), and nickel (Ni). In one embodiment, the second layer may be deposited using an electroless deposition process, a conventional physical vapor deposition (PVD) process, or a conventional chemical vapor deposition (CVD) process.

Electrochemical Metal Layer formation Process(es)

Figure 1A:
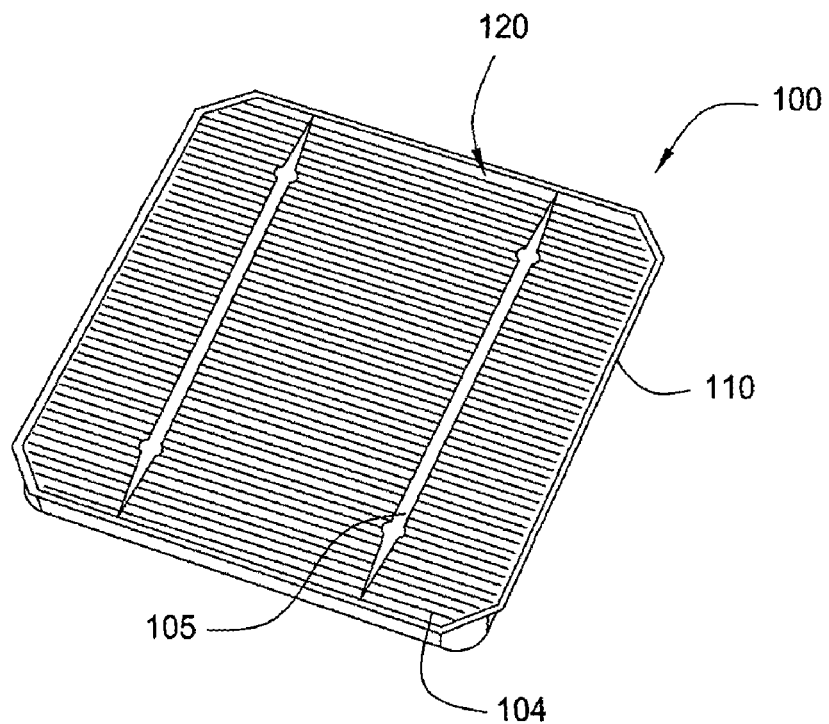
FIG. 1A (prior art) illustrates an isometric view of a solar cell containing a front side metallization interconnect pattern.
Figure 1B:
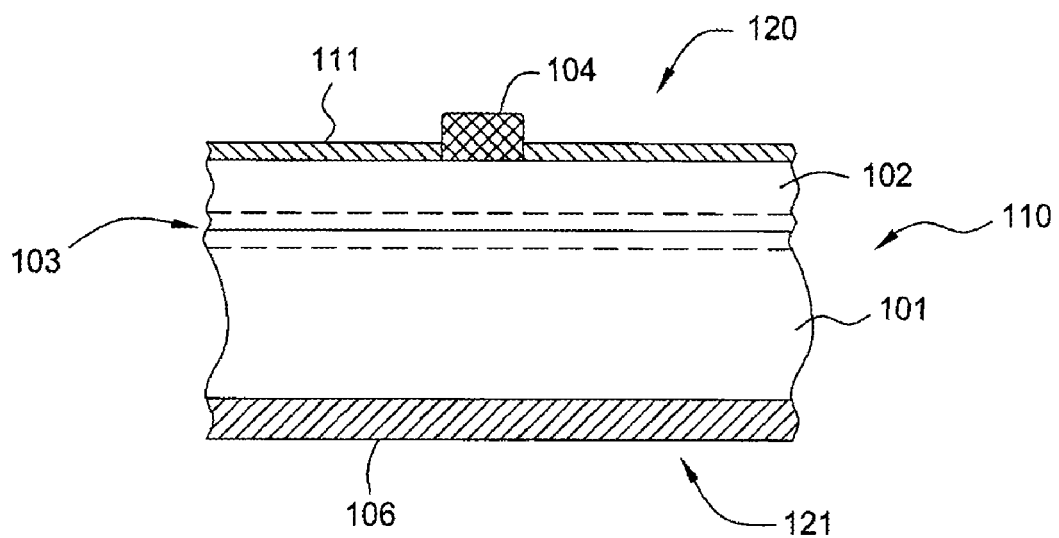
FIG. 1B (prior art) illustrates a cross-sectional side view of the solar cell shown in FIG. 1A.
Figure 1C:
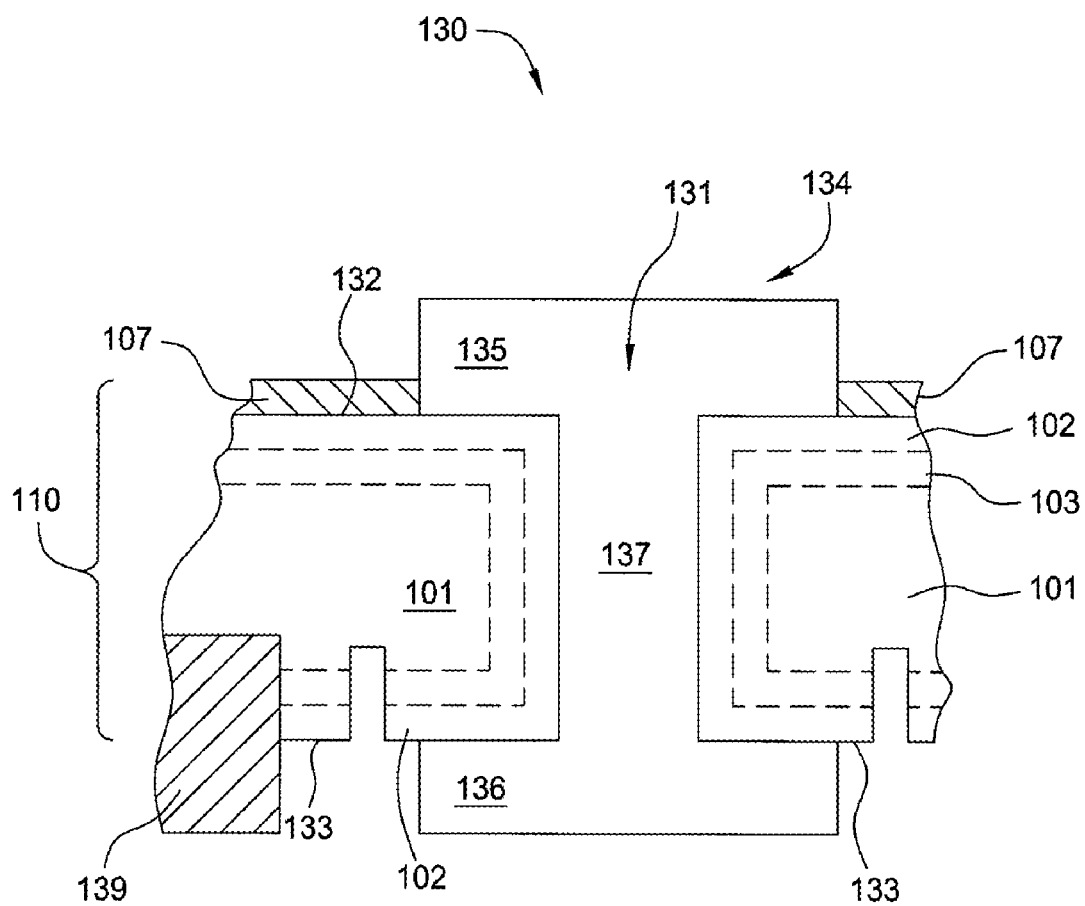
FIG. 1C (prior art) illustrates a plan view of a top contact structure of a PUM cell, wherein the finger width and geometry have been optimized to maximize cell efficiency.
Figure 1D:
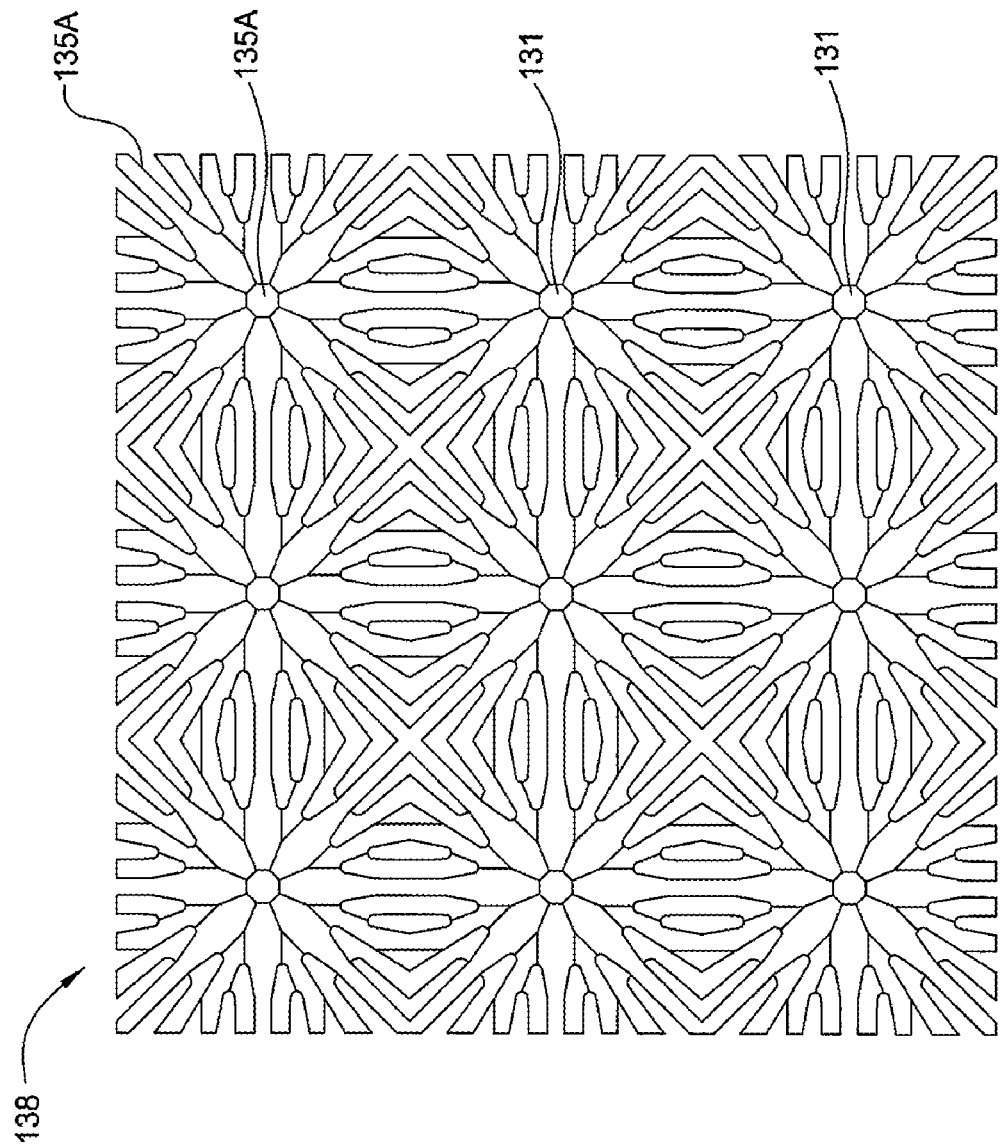
FIG. 1D illustrates a plan view of a top contact structure of a PUM cell, wherein the finger width and geometry have been optimized to maximize cell efficiency.

In the second processing step 216 of step 206, which is discussed below in conjunction with FIGS. 2B and 3F, a metal layer 306 is formed over the seed layer 305 disposed on the flexible base 301, hereafter metallized flexible substrate 320, by use of the electrochemical deposition process. In one embodiment, the metal layer 306 is deposited selectively over desired regions of the seed layer 305 using a masking plate 410 that contains apertures 413 that preferentially allow the electrochemically deposited material to form therein. In this process step, the seed layer 305 is cathodically biased relative to an electrode 420 (FIG. 4B) using a power supply 450, which causes the ions in an electrolyte to form a metal layer 306 on the exposed areas of the seed layer 305 created within the apertures 413. In one embodiment, the light-receiving side of the flexible solar cell may have a metal pattern similar to the pattern shown in FIG. 1C, which is discussed above.

Figure 4A:
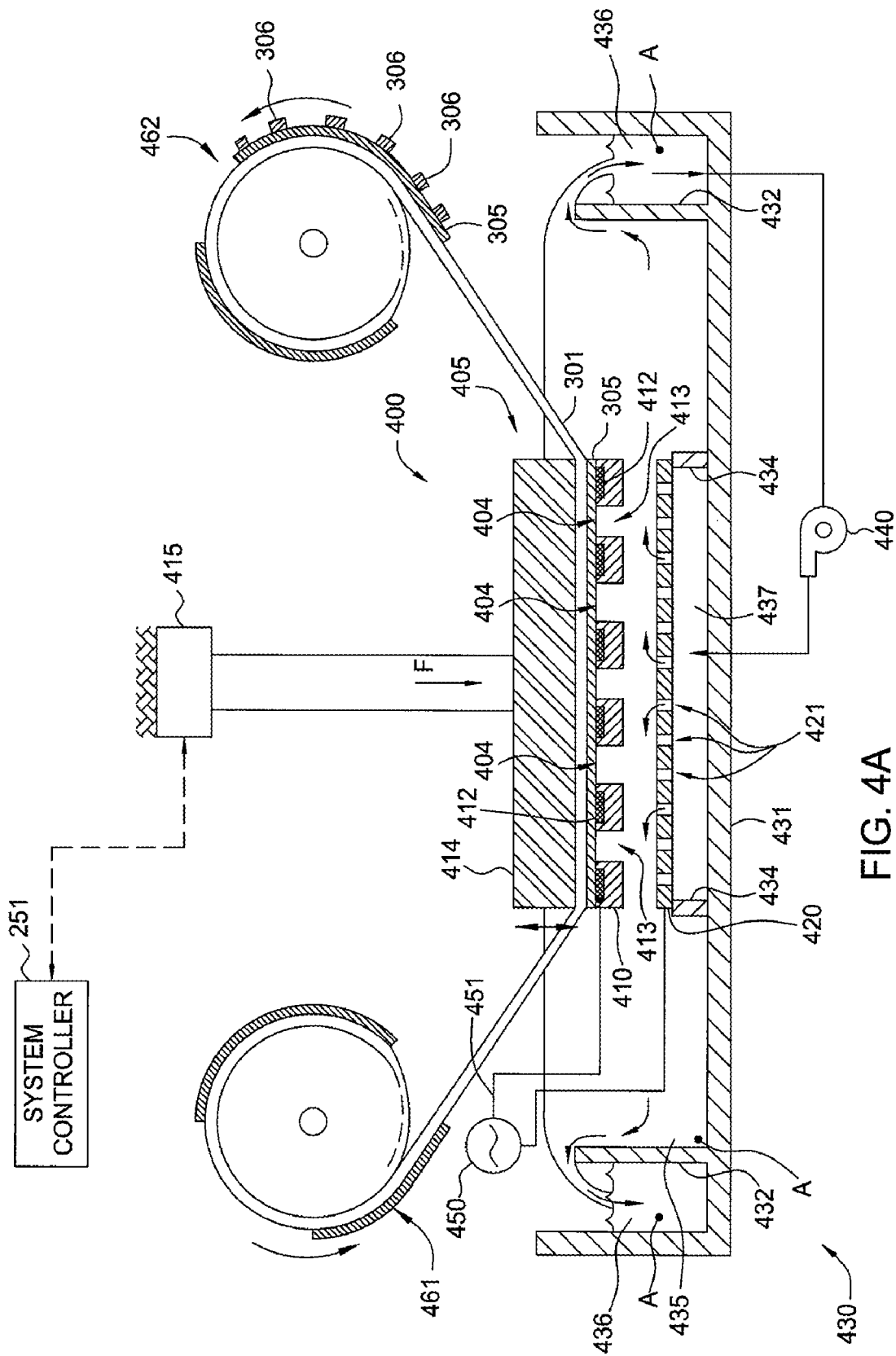
FIGS. 4A-4B illustrate isometric side cross-sectional views of electrochemical processing chambers according to embodiments described herein.
Figure 4B:
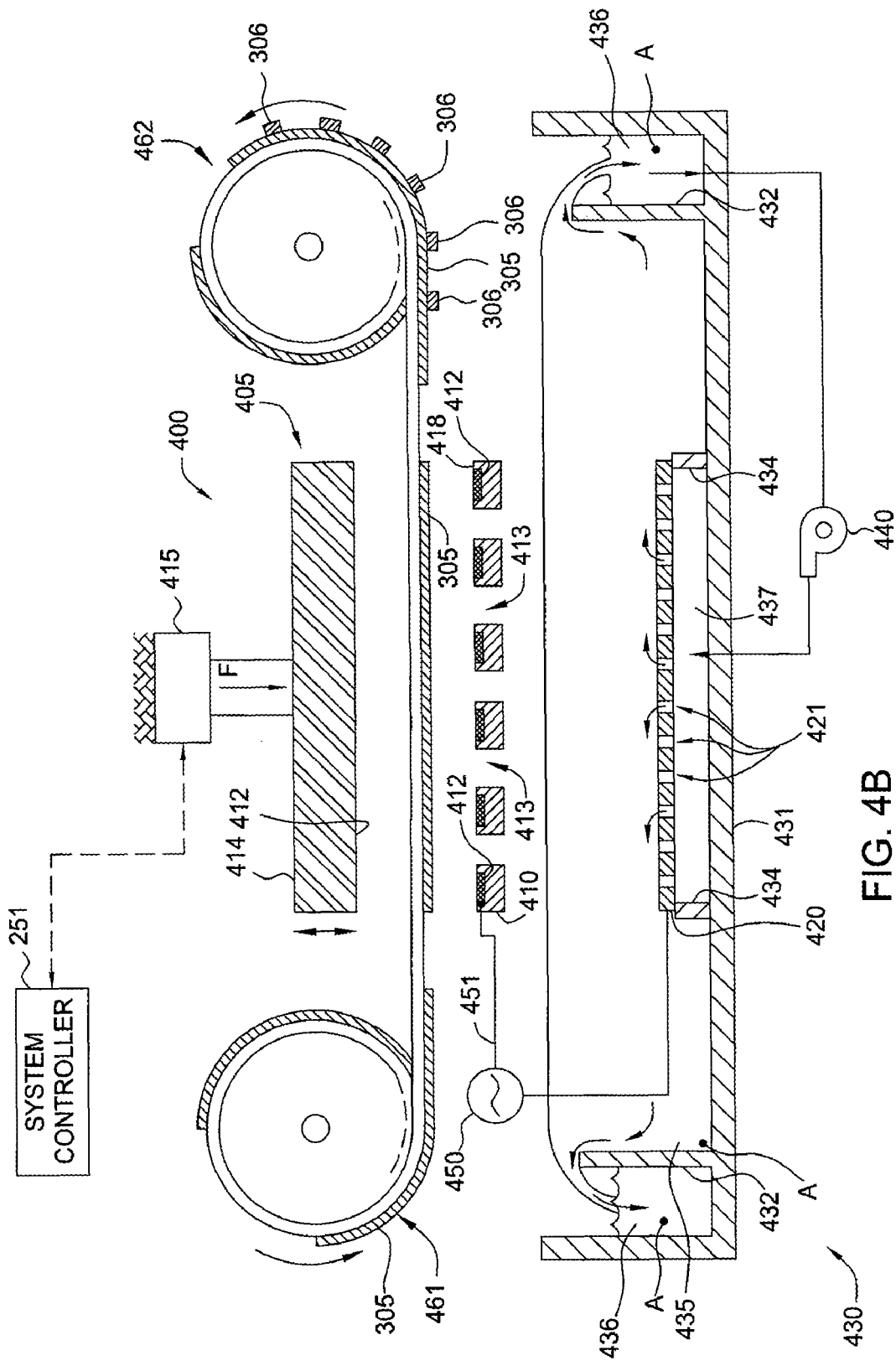
Figure 4C:
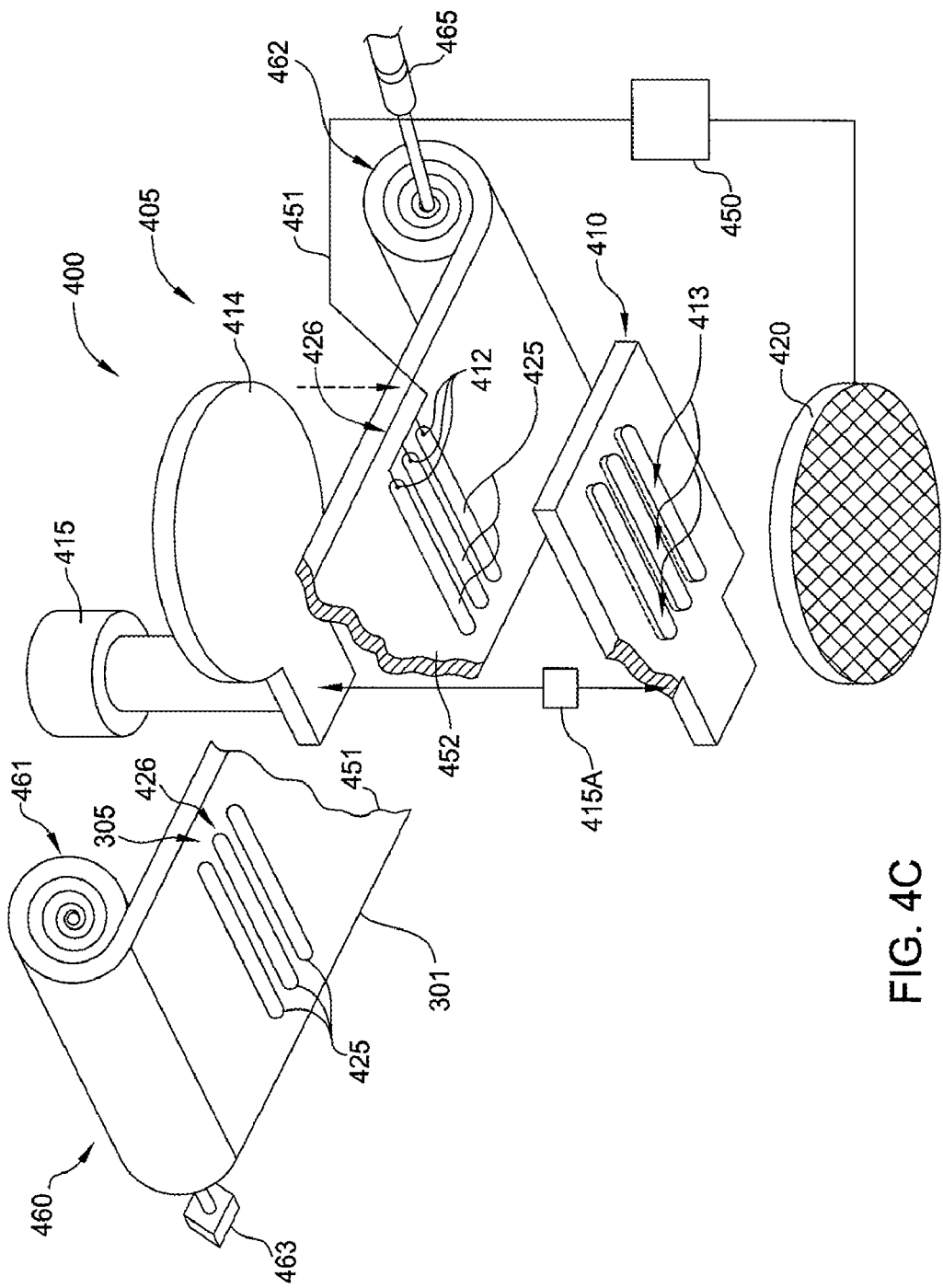
FIG. 4C illustrates an isometric side cross-sectional view of an electrochemical processing chamber according to one embodiment described herein.

FIGS. 4A-4C illustrate various embodiments of an electrochemical plating cell 400 that may be used to electrochemically deposit a metal layer 306 on the seed layer 305 during step 206. While FIGS. 4A-4C illustrate the substrate in a face-down configuration (e.g., seed layer 305 is facing down) this configuration is not intended to be limiting as to the scope of the invention, since the electrochemical plating cell 400 can be in any desirable orientation, such as face-up or vertically oriented at some desirable angle.

FIG. 4A is a side cross-sectional view that illustrates the electrochemical plating cell 400 that may be used to electrochemically deposit a metal layer 306 on a portion of the metallized flexible substrate 320 contained in the flexible substrate assembly 460 during step 206. Generally, the electrochemical plating cell 400 generally contains a head assembly 405, flexible substrate assembly 460, an electrode 420, a power supply 450, and a plating cell assembly 430. The head assembly 405 generally contains a thrust plate 414 and a masking plate 410 that is adapted to hold a portion of the metallized flexible substrate 320 in a position relative to the electrode 420 during the electrochemical deposition process. In one aspect, a mechanical actuator 415 is used to urge the thrust plate 414 and metallized flexible substrate 320 against electrical contacts 412 so that an electrical connection can be formed between a seed layer 305 formed on the surface of the metallized flexible substrate 320 and the power supply 450 through the lead 451. In one embodiment, as shown in FIG. 4A, the electrical contacts 412 are formed on a surface of the masking plate 410. In another embodiment, the electrical contacts 412 may be formed from separate and discrete conductive contacts that are nested within a recess formed in the masking plate 410 when the metallized substrate is being urged against the masking plate 410. The electrical contacts (e.g., contacts 412) may be formed from a metal, such as platinum, gold, or nickel, or another conductive material, such as graphite, copper Cu, phosphorous doped copper (CuP), and platinum coated titanium (Pt/Ti).

The flexible substrate assembly 460 may contain a feed roll 461, a feed actuator 463 (FIG. 4C), a take-up roll 462, and a take-up actuator 465 (FIG. 4C) that is used to feed, position portions of the flexible base 301 within the electrochemical plating cell 400 during processing. In one aspect, the feed roll 461 contains an amount of the flexible base 301 on which a seed layer 305 has been formed prior to forming the metal layer 306 in step 216. The take-up roll 462 generally contains an amount of the flexible base 301 after the metal layer 306 in step 216 is formed. The feed actuator 463 and take-up actuator 465 are used to position and apply a desired tension to the flexible base 301 so that the electrochemical processes can be performed on thereon. The feed actuator 463 and take-up actuator 465 may be DC servo motor, stepper motor, mechanical spring and brake, or other device that can be used to position and hold the flexible substrate in a desired position with the electrochemical plating cell 400.

FIG. 4B is a side cross-sectional view that illustrates the electrochemical plating cell 400 in an "open" position so that the metallized flexible substrate 320 can be positioned prior to moving a desired portion of the flexible base 301 containing the seed layer 305 into a desired position relative to masking plate 410 and the electrode 420 so that a metal layer 306 will be formed thereon. In on aspect, various convention encoders or other devices are used in conjunction with the feed actuator 463 and/or take-up actuator 465 to control and position a desired portion of the flexible base 301 containing a seed layer 305 within the head assembly 405 prior to performing step 216.

Referring to FIG. 4A, the plating cell assembly 430 generally contains a cell body 431 and an electrode 420. The cell body 431 will generally contain a plating region 435 and an electrolyte collection region 436 that contains an electrolyte (e.g., item "A") that is used to electrochemically deposit the metal layer on the substrate surface. In operation it is generally desirable to pump an electrolyte "A" from the electrolyte collection region 436 through a plenum 437 formed between the electrode 420 and the support features 434 past the apertures 413 formed in the masking plate 410 and then over a weir 432 separating the plating region 435 and to the electrolyte collection region 436, by use of a pump 440. In one aspect, the electrode 420 may be supported on one or more support features 434 formed in the cell body 431. In one embodiment, the electrode 420 contains a plurality of holes 421 that allow the electrolyte "A" passing from the plenum 437 to the plating region 435 to have a uniform flow distributed across masking plate 410 and contact at least one surface on the metallized flexible substrate 320. The fluid motion created by the pump 440 allows the replenishment of the electrolyte components at the exposed region 404 that is exposed at one ends of the apertures 413. The electrode 420 may be formed from material that is consumable (e.g., copper) during the electroplating reaction, but is more preferably formed from a non-consumable material. A non-consumable electrode may be made of a conductive material that is not etched during the formation the metal layer 306, such as platinum or ruthenium coated titanium.

FIG. 4C illustrates an isometric exploded view of the head assembly 405, flexible substrate assembly 460, masking plate 410, and electrode 420 that are also shown in FIGS. 4A-4B. In one aspect, the seed layer 305 formed on the flexible base 301 is formed in discrete regions 426 that contain a plurality of features 425. The features 425 are small section of the seed layer 305 that may be formed in a desired pattern on the surface of the metallized flexible substrate 320 so that multiple solar cell devices can be formed by eventually cutting the metallized flexible substrate 320 into pieces. In this configuration, apertures 413 formed in the masking plate 410 can be aligned and used to preferentially deposit the metal layer 306 on the formed features 425, when the masking plate 410 is placed in contact with the surface of the metallized flexible substrate 320. The mechanical actuator 415 can be used to urge the thrust plate 414 and metallized flexible substrate 320 against electrical contacts 412 so that an electrical connection can be formed between the features 425 and the power supply 450 through the lead 451. The masking plate 410 is generally made of a dielectric material that has a plurality of apertures 413 formed therein that allow the electrolyte "A" to contact exposed regions on the substrate surface. An electrochemically deposited metal layer can be formed in the exposed regions 404 on the processing surface of the substrate when a cathodic bias of a sufficient magnitude is applied to the features 425. In one embodiment, the masking plate 410 is made of glass, a plastic material, and/or a ceramic material that contains a plurality of apertures 413 that are formed in the masking plate 410 using conventional machining operations, such as laser cutting, milling, water-jet cutting, drilling, electro-discharge machining (EDM), or stamping processes. In one embodiment, the masking plate 410 may be formed from $SiO_2$, polyimide, quartz, or other ceramic, plastic, polymeric material or glass material, for example. In general, the masking plate 410 must be thicker than the maximum electrochemical deposition thickness to allow the masking plate to be separated from the substrate after the deposition process has been performed. Typically, the masking plate may be between about 100 μm and about 1 cm thick. In one embodiment, the surface of the masking plate 410 that is in contact with the processing surface of the substrate contains a compliant material that is adapted to compensate for surface topography on the substrate surface and/or more actively prevent plating of on these covered surfaces. Complaint materials may include polymeric materials (e.g., rubber materials) that will not be chemically attacked by the electrolyte.

It should be noted that the apertures 413 formed in the masking plate 410 may be formed in any desirable shape and/or pattern. In one embodiment, the apertures 413 formed in the masking plate 410 may be a rectangular or a circular feature that is between about 100 μm and about 240 μm in size. In another embodiment, the apertures formed in the masking plate 410 may be a rectangular features that are between about 100 μm and about 240 μm wide and have a length that extends across the substrate surface, such as between about 100 μm and about 40 cm in length. In another embodiment, the apertures formed in the masking plate 410 may be a rectangular features that are used to form an interconnecting element 807 (see FIGS. 8A-8B below) that contains electrical interconnects 811 that are formed on a flexible base 806, which may be between about 30 cm and about 4 meters in length. In one embodiment, the total exposed area on the surface of the substrate, which is the sum of all of the cross-sectional areas of all of the apertures 413 at the contacting surface 418 of the masking plate 410, is between about 0.5% and about 100% of the surface area of the surface of the substrate that is in contact with the masking plate 410. In one embodiment, the total exposed area of the apertures that are in contact with the non-light-receiving surface, or backside, of the substrate is greater than about 70% of the surface area of the non-light-receiving surface of the substrate. In one embodiment, the total exposed area of the apertures that are in contact with the light-receiving surface of the substrate is less than about 30% of the surface area of the light-receiving surface of the substrate. Preferably, the total exposed area of the apertures that are in contact with the light-receiving surface of the substrate is less than about 10%.

The system controller 251 is adapted to control the various components used to complete the electrochemical process performed in the electrochemical plating cell 400. The system controller 251 is generally designed to facilitate the control and automation of the overall process chamber and typically includes a central processing unit (CPU) (not shown), memory (not shown), and support circuits (or I/O) (not shown). The CPU may be one of any form of computer processors that are used in industrial settings for controlling various system functions, chamber processes and support hardware (e.g., detectors, robots, motors, gas sources hardware, etc.) and monitor the electrochemical plating cell processes (e.g., electrolyte temperature, power supply variables, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 251 determines which tasks are performable on a substrate. Preferably, the program is software readable by the system controller 251 that includes code to perform tasks relating to monitoring and execution of the electrochemical process recipe tasks and various chamber process recipe steps.

In one embodiment of step 216, one or more direct current (DC) and/or pulse plating waveforms are delivered to the seed layer 305 during the electrochemical deposition process to form the metal layer 306 that has desirable electrical and mechanical properties. The applied bias may have a waveform that is DC and/or a series of pulses that may have a varying height, shape and duration to form the conductor 325. In one embodiment, a first waveform is applied to the seed layer 305 by use of a power supply 450 to cause some electrochemical activity at the surface of the seed layer. In this case, while the bias applied to the seed layer need not always be cathodic, the time average of the energy delivered by the application of the first waveform is cathodic and thus will deposit a metal on the surface of the seed layer 305. In another embodiment, it may be desirable to have a time average that is anodic (i.e., dissolution of material) to clean the surface of the seed layer prior to performing the subsequent filling process steps. The concentration gradients of metal ions or additives in the electrolyte "A" (FIG. 4A) in the proximity of the conductor 325 are affected by the polarity, sequencing, and durations of bias delivered to the surface of the substrate. For example, it is believed that the duration of a deposition pulse during a pulse plating type process controls the deposition on the sidewall of the feature, while the dissolution pulse creates additional metal ions and thus, a concentration gradient of these ions, around the feature. By dissolving some deposited metal from the top of the feature, an electrodissolution pulse (or reverse pulse) allows sufficient time for bottom-up growth within the high aspect ratio feature, without void or seam formation.

In one example, as shown in FIG. 5, in step 216 a series of different waveforms are applied to the seed layer 305 and electrode 420 (FIGS. 4A-4B) by the power supply 450 to form the conductor 325. Referring to FIG. 5, a first waveform having both cathodic and anodic pulses of a desired magnitude (e.g., $V_1$ and $V_4$, respectively) and duration are delivered to the seed layer 305 for a period of time $t_1$. Next, a second DC type waveform having a magnitude $V_2$ and $V_3$ are delivered during a period of time $t_2$ and then a third pulse type waveform having an increasing magnitude (e.g., between $V_2$ and $V_3$,) is delivered to the seed layer 305 during the period of time $t_3$. Finally, a fourth waveform having both cathodic and anodic pulses of a desired magnitude (e.g., $V_1$ and $V_4$, respectively) and duration are delivered to the seed layer 305 during a period of time $t_4$. It should be noted that the shape of the pulses, the relative magnitudes of the pulses within each waveform, the number pulse per waveform, and/or the duration of each pulse or waveform illustrated in this example are not intended to be limiting as to the scope of the invention described herein.

It is believed that by controlling the magnitude, duration and polarity of successive pulses the grain size of the metal layer formed using an electrochemical deposition process can be controlled. It is generally well known that by using pulse plating waveform that has many rapid pulses that have a high magnitude or a number of pulses having alternating polarity will generate a layer that has a lower stress and generally a smaller grain size than an electrochemically deposited layer that is formed using a DC waveform or pulse type waveform that are of a longer duration and/or have a smaller pulse magnitude. Therefore, by controlling the waveform, deposition rate, and chemistry used to form the metal layer 306 having a varying grain size a low stress metal layer can be formed that is able to form a reliable low stress conductors 325 on the surface of the substrate.

Electrolyte Solution

In general, it is desirable to form a conductor 325 that is defect free, has a low stress that can fill any deep features formed on the substrate surface from the bottom-up. The electrochemical process performed in the electrochemical plating cell 400 utilizes an electrolyte solution containing a metal ion source and an acid solution. In some cases one or more additives, such as an accelerator, a suppressor, a leveler, a surfactant, a brightener, or combinations thereof may be added to the electrolyte solution to help control the grain size and uniformity of the electrochemically deposited metal layer(s). However, additives generally make the control of the electrochemical process more complex and make the cost of the consumables generated during the electrochemical plating process to increase, since they are generally consumed or breakdown during the electrochemical process. In one embodiment, to increase the planarization power, the electrolyte can optionally contain an inorganic acid, (e.g., sulfuric acid, phosphoric acid or pyrophosphoric acid), various inorganic supporting salts, and other additives that may be used to improve the quality of plated surfaces (e.g., oxidizers, surfactants, brighteners, etc.).

Figure 2B:
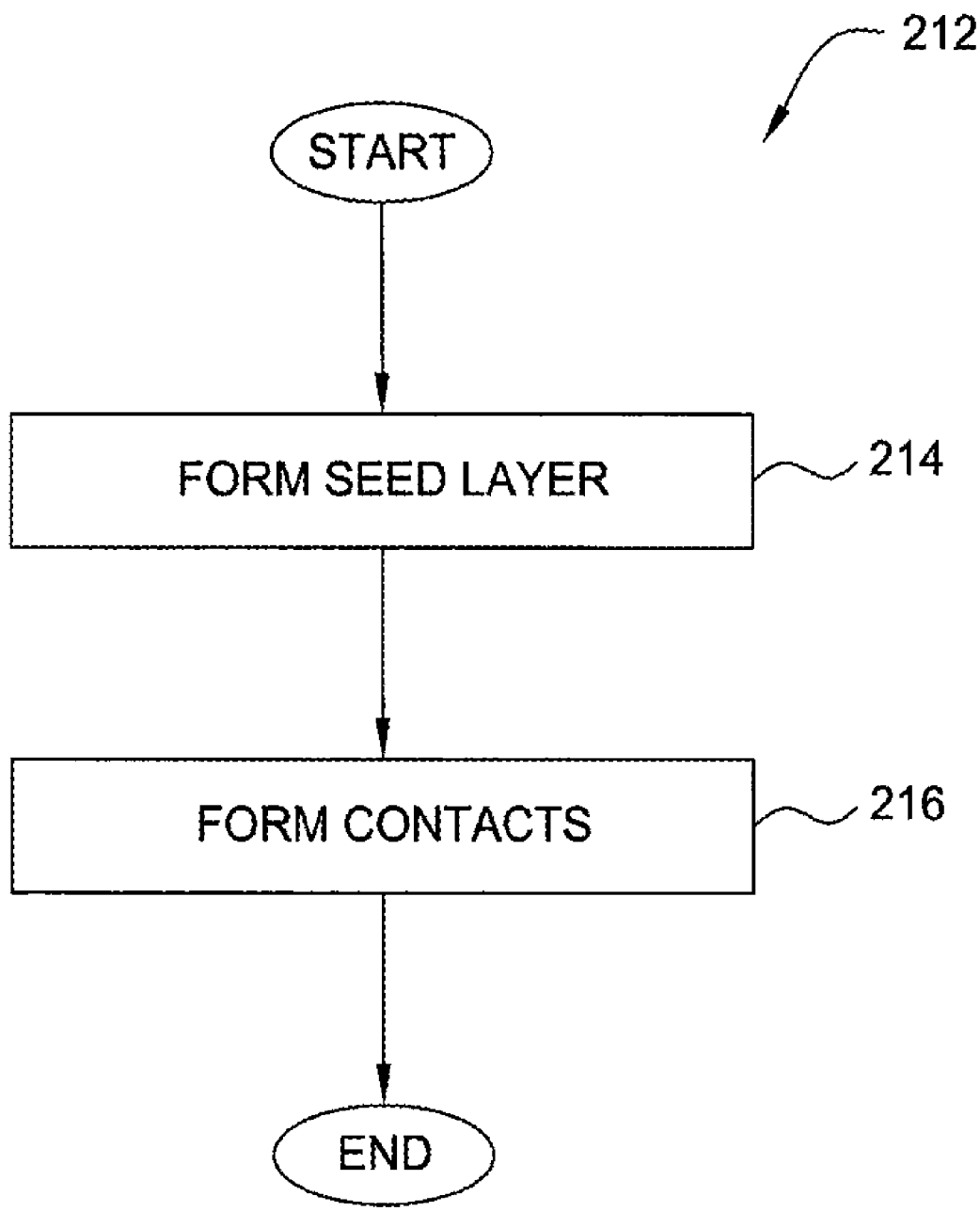
FIG. 2B illustrates a metallization process sequence according to one embodiment described herein.

In one example, the metal ion source within the electrolyte solution used in step 216 in FIG. 2B is a copper ion source. In one embodiment, the concentration of copper ions in the electrolyte may range from about 0.1 M to about 1.1M, preferably from about 0.4 M to about 0.9 M. Useful copper sources include copper sulfate ($CuSO_4$), copper chloride ($CuCl_2$), copper acetate ($Cu(CO_2CH_3)_2$), copper pyrophosphate ($Cu_2P_2O_7$), copper fluoroborate ($Cu(BF_4)_2$), derivatives thereof, hydrates thereof or combinations thereof. The electrolyte composition can also be based on the alkaline copper plating baths (e.g., cyanide, glycerin, ammonia, etc) as well.

In one example, the electrolyte is an aqueous solution that contains between about 200 and 250 g/l of copper sulfate pentahydrate ($CuSO_4.5(H_2O)$), between about 40 and about 70 g/l of sulfuric acid ($H_2SO_4$), and about 0.04 g/l of hydrochloric acid (HCl). In some cases it is desirable to add a low cost pH adjusting agent, such as potassium hydroxide (KOH) or sodium hydroxide (NaOH) to form an inexpensive electrolyte that has a desirable pH to reduce the cost of ownership required to form a metal contact structure for a solar cell. In some cases it is desirable to use tetramethylammonium hydroxide (TMAH) to adjust the pH.

In another example, the electrolyte is an aqueous solution that contains between about 220 and 250 g/l of copper fluoroborate ($Cu(BF_4)_2$), between about 2 and about 15 g/l of tetrafluoroboric acid ($HBF_4$), and about 15 and about 16 g/l of boric acid ($H_3BO_3$). In some cases it is desirable to add a pH adjusting agent, such as potassium hydroxide (KOH), or sodium hydroxide (NaOH) to form an inexpensive electrolyte that has a desirable pH to reduce the cost of ownership required to form a metal contact structure for a solar cell. In some cases it is desirable to use tetramethylammonium hydroxide (TMAH) to adjust the pH.

In yet another example, the electrolyte is an aqueous solution that contains between about 60 and about 90 g/l of copper sulfate pentahydrate ($CuSO_4 \cdot 5(H_2O)$), between about 300 and about 330 g/l of potassium pyrophosphate ($K_4P_2O_7$), and about 10 to about 35 g/l of 5-sulfosalicylic acid dehydrate sodium salt ($C_7H_5O_6SNa \cdot 2H_2O$). In some cases it is desirable to add a pH adjusting agent, such as potassium hydroxide (KOH), or sodium hydroxide (NaOH) to form an inexpensive electrolyte that has a desirable pH to reduce the cost of ownership required to form a metal contact structure for a solar cell. In some cases it is desirable to use tetramethylammonium hydroxide (TMAH) to adjust the pH.

In yet another example, the electrolyte is an aqueous solution that contains between about 30 and about 50 g/l of copper sulfate pentahydrate ($CuSO_4 \cdot 5(H_2O)$), and between about 120 and about 180 g/l of sodium pyrophosphate decahydrate ($Na_4P_2O_7 \cdot 10(H_2O)$). In some cases it is desirable to add a pH adjusting agent, such as potassium hydroxide (KOH), or sodium hydroxide (NaOH) to form an inexpensive electrolyte that has a desirable pH to reduce the cost of ownership required to form a metal contact structure for a solar cell. In some cases it is desirable to use tetramethylammonium hydroxide (TMAH) to adjust the pH.

In one embodiment, it may be desirable to add a second metal ion to the primary metal ion containing electrolyte bath (e.g., copper ion containing bath) that will plate out or be incorporated in the growing electrochemically deposited layer or on the grain boundaries of the electrochemically deposited layer. The formation of a metal layer that contains a percentage of a second element can be useful to reduce the intrinsic stress of the formed layer and/or improve its electrical and electromigration properties. In one example, it is desirable to add an amount of a silver (Ag), nickel (Ni), zinc (Zn), or tin (Sn) metal ion source to a copper plating bath to form a copper alloy that has between about 1% and about 4% of the second metal in the deposited layer.

In one example, the metal ion source within the electrolyte solution used in step 216 in FIG. 2B is a silver, tin, zinc, or nickel ion source. In one embodiment, the concentration of silver, tin, zinc or nickel ions in the electrolyte may range from about 0.1 M to about 0.4M. Useful nickel sources include nickel sulfate, nickel chloride, nickel acetate, nickel phosphate, derivatives thereof, hydrates thereof or combinations thereof.

Contact Interface Layer

Figure 3G:
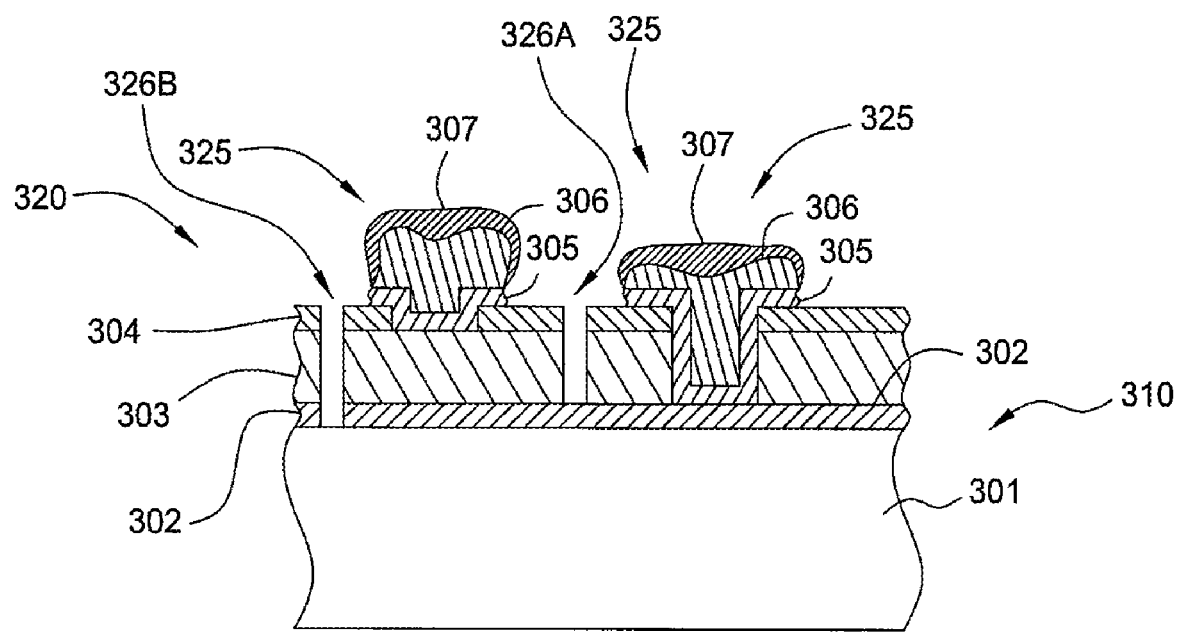

Referring to FIGS. 2A and 3G, in step 208 an optional contact interface layer 307 is deposited over the surface of the metal layer 306 formed during step 216. The contact interface layer 307 can be formed using an electrochemical deposition process, an electroless deposition process, a conventional selective CVD deposition process, or other comparable deposition processes to form a good ohmic contact between the formed conductors 325 and an external interconnection bus (not shown) that is adapted to connect one or more solar cells together. In one embodiment, the contact interface layer 307 is formed from a metal that is different from the metal contained in the metal layer 306. In this configuration the contact interface layer 307 may be formed from a pure metal or metal alloy that contains metals, such as tin (Sn), silver (Ag), gold (Au), lead (Pb), or ruthenium (Ru). In one embodiment, the thickness of the contact interface layer 307 may be between about 3 μm and about 7 μm. Forming a contact interface layer 307 having a thickness greater than 3 μm is generally hard to accomplish using conventional electroless, PVD or CVD techniques at an acceptable substrate throughput and/or desirable deposition thickness uniformity.

In one embodiment, the contact interface layer 307 is formed by use of an electrochemical process. In some cases it is desirable to perform step 208 in the same electrochemical plating cell as step 216 was performed. In this configuration, the seed layer 305 and metal layer 306 are cathodically biased relative to an electrode (e.g., electrode 420 in FIG. 4A) using a power supply that causes the ions in an contact interface layer electrolyte, which is brought into contact with the seed layer 305, metal layer 306 and the electrode, to plate the contact interface layer 307 on the surface of the seed layer 305 and/or metal layer 306. In the case where the contact interface layer 307 is formed in the same electrochemical plating cell 400 as the metal layer 306 and the contact interface layer 307 contains one or more different elements than the metal layer 306 the electrolyte used to form the metal layer will need to be discarded and replaced with the new contact interface layer electrolyte to form the contact interface layer 307.

Contact Interface Layer Electrolyte Solution

Referring to FIG. 3G, in one embodiment, the contact interface layer 307 contains tin (Sn) and is deposited by use of an electrochemical deposition process. The concentration of tin ions in the contact interface layer electrolyte may range from about 0.1 M to about 1.1M. Useful tin sources include tin sulfate ($SnSO_4$), tin chloride ($SnCl_2$), and tin fluoroborate ($Sn(BF_4)_2$), derivatives thereof, hydrates thereof or combinations thereof. In another embodiment, to increase the planarization power, the electrolyte can optionally contain an inorganic acid, (e.g., sulfuric acid, phosphoric acid or pyrophosphoric acid), various inorganic supporting salts, and other additives that may be used to improve the quality of plated surfaces (e.g., oxidizers, surfactants, brighteners, etc.). The electrolyte composition can also be based on the alkaline tin plating baths (e.g., cyanide, glycerin, ammonia, etc) as well. The electrolyte may also contain methane-sulfonic acid (MSA).

In one example, the electrolyte is an aqueous solution that contains between about 200 and 250 g/l of tin sulfate pentahydrate ($SnSO_4 \cdot 5(H_2O)$), between about 40 and 70 g/l of sulfuric acid ($H_2SO_4$), and about 0.04 g/l of hydrochloric acid (HCl). In some cases it is desirable to add one or more organic additives (e.g., levelers, accelerators, suppressors) to promote uniform growth of the deposited layer. In some cases it is desirable to add a low cost pH adjusting agent, such as potassium hydroxide (KOH) or sodium hydroxide (NaOH) to form an inexpensive electrolyte that has a desirable pH to reduce the cost of ownership required to form a metal contact structure for a solar cell. In some cases it is desirable to use tetramethylammonium hydroxide (TMAH) to adjust the pH.

In an effort to reduce the production time to form the metal layers 306 and/or 307 it is desirable to take steps to maximize the plating rate, while producing a low stress uniform layer that has good electrical properties. Typical methods that can be used to improve the plating rate include agitation of the electrolyte solution, increase the electrolyte flow and or motion of the substrate in the electrolyte. In one aspect, the plating rate is increased by controlling the temperature of electrolyte. In one embodiment, the temperature of the electrolyte is controlled within a range of about 18° C. and about 85° C., and preferably between about 30° C. and about 70° C. to maximize the plating rate. It has been found that the higher the temperature the faster the plating rate.

Referring to FIG. 2, in one embodiment, an optional metal layer removal step, or step 209, is performed after completing step 208. The metal layer removal step generally entails performing a conventional wet or dry etching step to remove any unwanted and/or excess metal found on the surface of the substrate, such as unused or un-necessary portions of the seed layer 305. Conventional wet etching steps may involve immersing the substrate in an acidic or basic solution that is adapted to remove the unwanted and/or excess metal on the surface of the substrate. In one embodiment, a wet etch chemistry that preferentially etches the seed layer 305 versus the material in the interface layer 307.

Multiple Metallization Steps

The embodiments discussed above in conjunction with FIGS. 2-5 can be used to form one or more of the conductors 325 on a surface of the substrate. While it is generally desirable to form all of the various contact structures used to form a solar cell device at one time, this is sometimes not possible due to various processing constraints. Referring to FIG. 3F, in some cases two metallization processes are required, for example, to form the first contact on the top surface (left side of figure), as shown in FIG. 3F, and a second metallization process to form a second contact on a different region of the metallized flexible substrate 320 (right side of figure). Each of the two metallization processes may include steps 202-208, discussed above.

Disposable Masking Plate

Figure 6A:
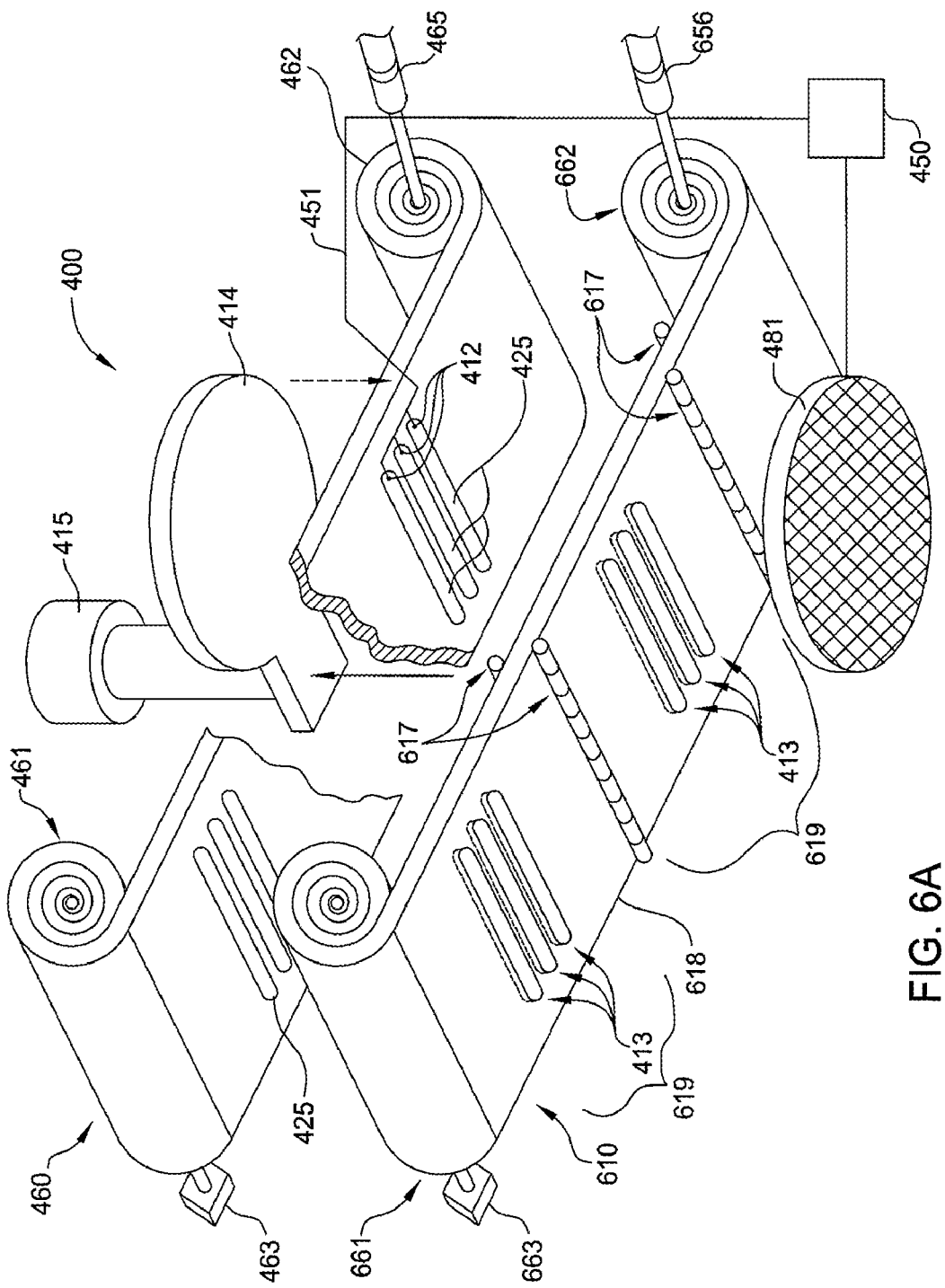
FIGS. 6A-6B illustrate isometric view of electrochemical plating chambers according to embodiments described herein.
Figure 6B:
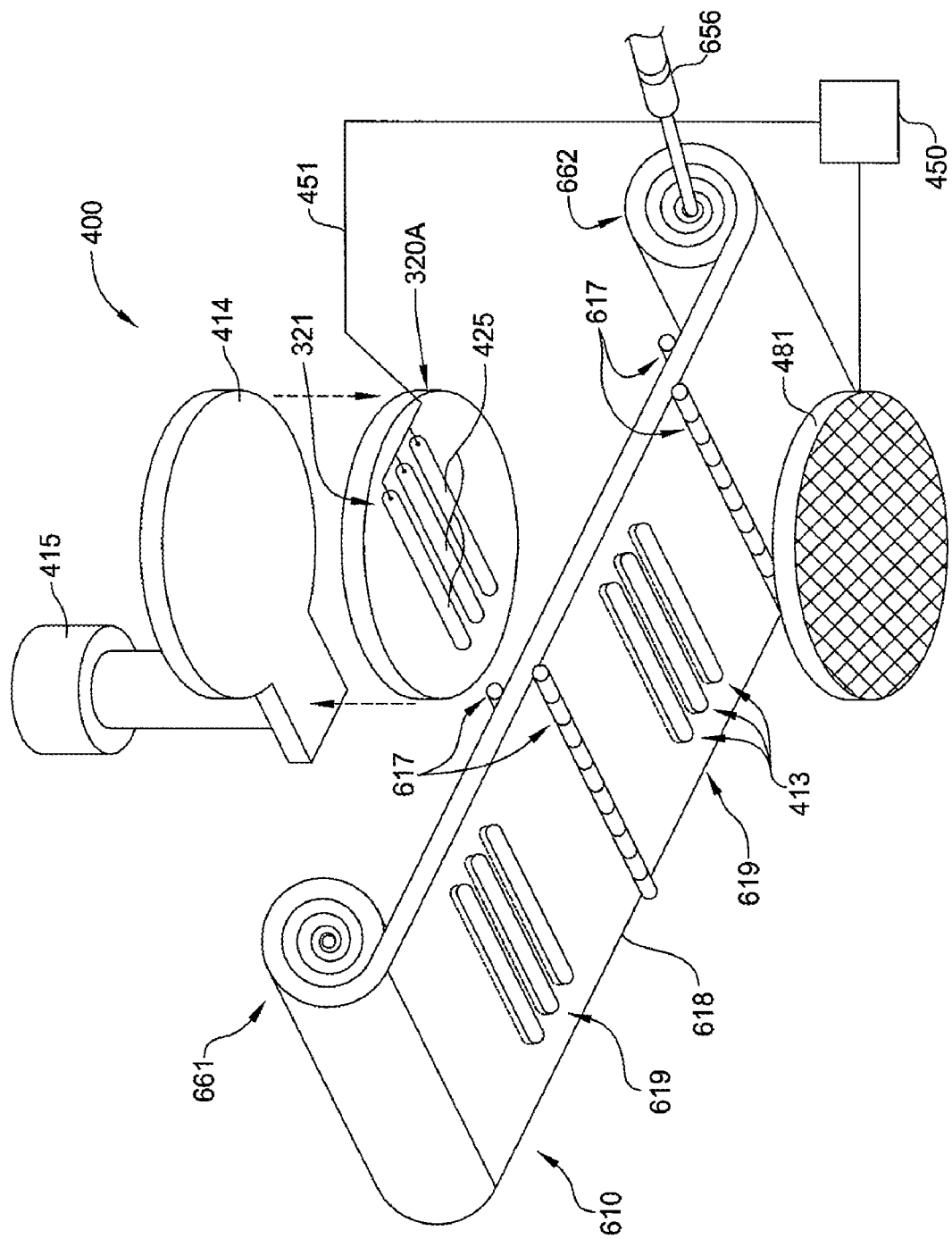

In one embodiment of the electrochemical plating cell 400, as shown in FIGS. 6A and 6B, the masking plate 410 (FIG. 4A) is replaced with a masking plate assembly 610 that may provide an inexpensive processing apparatus that will deliver repeatable process results and not be affected by repetitive deposition processes. The masking plate assembly 610 may contain a flexible masking substrate 618 that contains a plurality of apertures 413 formed therein, a take up roll 662, a take-up actuator 663, a feed roll 661, a feed actuator 656, and support rollers 617. The apertures 413 formed in the flexible masking substrate 618 will generally be aligned and grouped in aperture regions 619 that allow a metal layer to be formed in a desired pattern on the features 425 during the electrochemical process performed in step 216. The aperture regions 619 can positioned relative to the features 425 formed on the metallized flexible substrate 320 by use of the take-up actuator 663 and/or feed actuator 656 that rotate the feed roll 661 and the take-up roll 662. In one aspect, the electrical contacts 412 are stationary components that are sandwiched between the flexible masking substrate 618 and metallized flexible substrate 320 during processing so that a large enough force can be created to form a reliable contact to the features 425 formed on the metallized flexible substrate 320. In another embodiment, the electrical contacts 412 are electrically connected to metallized regions (not shown) formed on the surface of the flexible masking substrate 618, which when in use form an electrical connection between the power supply 450 and the features 425.

The support rollers 617 are positioned to support the flexible masking substrate 618 when the portion of the flexible base 301 is pressed against a surface of the flexible masking substrate 618 by the motion of the thrust plate 414 and actuator 415. After an aperture region 619 of the flexible masking substrate 618 has been used for a desired number of electrochemical plating processes the take-up actuator 663 and/or feed actuator 656 can be used to reposition the a new aperture region 619 in the old one's place so that a electrochemical plating process can be performed using the new aperture region 619. In this case a new aperture region 619 can be used to form a metal layer 306 on the surface of the substrate whenever the system controller 251 (FIG. 4A) or user decides the old aperture region 619 needs to be replaced.

The flexible masking substrate 618 is typically formed from a thin compliant material that can be inexpensively formed. In one aspect, the flexible substrate is formed from a plastic, polymeric or elastomeric material, such as Mylar™, polyethylene or other similar material. The thickness of the flexible masking substrate 618 may vary between about 10 μm and about 2 mm. The apertures 413 may be formed in the flexible masking substrate 618 using conventional stamping, laser cutting, punch and die techniques.

FIG. 6B illustrates another embodiment of the electrochemical plating cell 400, in which single substrates 320A are positioned over an aperture region 619 of the masking plate assembly 610 so that a metal layer 306 can be formed on the metallized features 425 formed on the single substrate 320A using step 206, discussed above. In one example, the single substrate 320A may be formed from a material, such as single crystal silicon, multi-crystalline silicon, polycrystalline silicon, germanium (Ge), gallium arsenide (GaAs), and/or heterojunction cells.

Processing System

Figure 7:
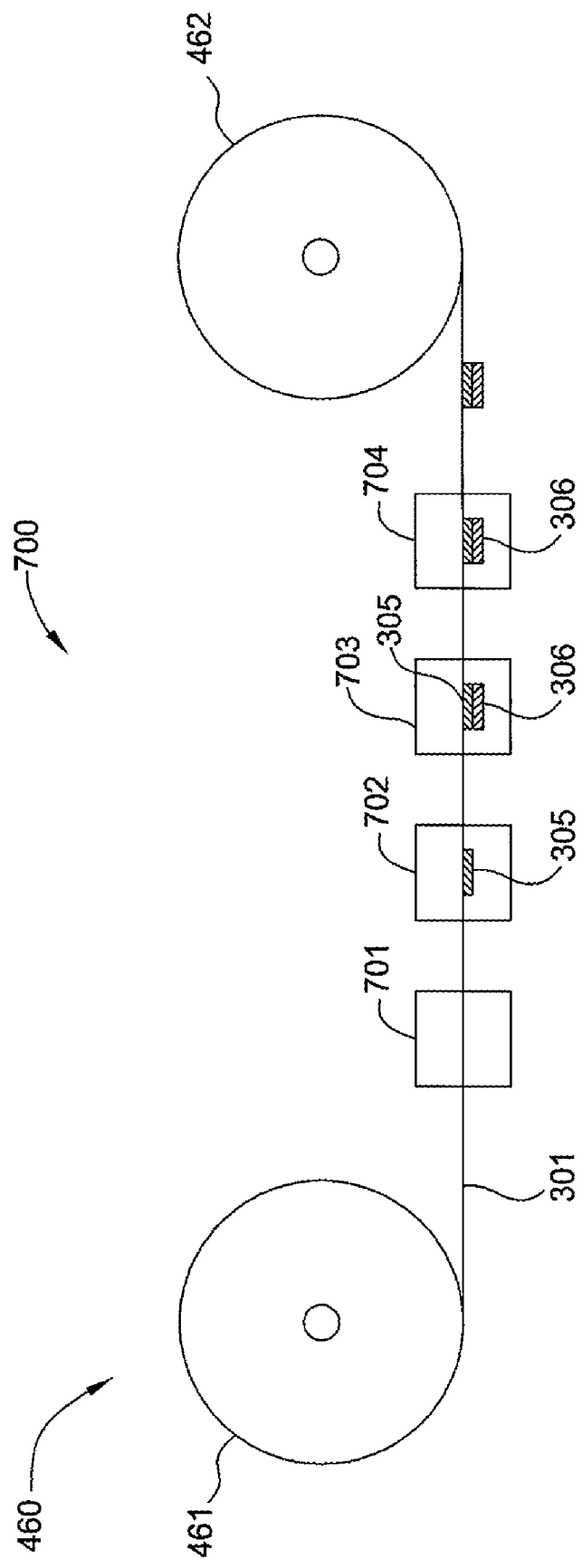
FIG. 7 illustrates is a schematic view of a processing system according to one embodiment described herein.

FIG. 7 Illustrates a schematic view of a flexible substrate processing system 700 where a flexible substrate assembly 460 is adapted to position the flexible base 301 in various preprocessing, metallization and post-processing chambers to form a substrate that has metallized features (e.g., conductors 325) formed thereon. In one embodiment, the flexible substrate assembly 460 is adapted to transfer the flexible base 301 through two or more processing chambers to form a substrate that has metallized features formed thereon by performing the process steps described in the method steps 200, discussed above. FIG. 7 illustrates a schematic view of one embodiment in which the flexible base 301 is transferred through four processing chambers 701-704. In one embodiment, the first processing chamber 701 is adapted to perform a preprocessing step, the second processing chamber 702 is adapted to deposit the seed layer 305, the third processing chamber 703 is adapted to electrochemically deposit a metal layer 306 on at least a portion of the seed layer 305, and a fourth processing chamber 704 that is adapted to perform a post processing step on the substrate.

In one embodiment, process chamber 701 is adapted to clean and/or prepare the surface of the flexible base 301 prior to performing subsequent processing steps. In one aspect, the process chamber is 701 is adapted to perform a preprocessing step before the seed layer 305 is deposited on the flexible base 301 in the processing chamber 702. A typical preclean step may include a rinse or immersion in a cleaning solution that may contain DI water and/or a cleaning agent to remove metals, particles, or other contamination found on the flexible substrate surface. The cleaning agent may be an acidic or basic solution that may contain hydrofluoric acid (HF), sulfuric acid ($H_2SO_4$), hydrochloric acid (HCl), ammonia ($NH_3$), or other suitable etchant or solvent. In one example, the cleaning solution contains sulfuric acid, hydrogen peroxide, and water mixed in a concentration of 3:1:1 by weight, which is used to etch copper.

In one embodiment, the process chamber 702 is adapted to deposit the seed layer 305 on the surface of the flexible base 301 using the process discussed above in conjunction with step 214. In one aspect, the seed layer 305 is formed in the process chamber 702 using a PVD deposition process or an electroless deposition process, as discussed above. In one embodiment, the process chamber 703 is adapted to perform an electrochemical deposition process to form the metal layer 306 using an apparatus or method discussed above in conjunction with FIGS. 2A-2B, 4A-4C, 5 and 6A-6B. In another embodiment, the process chamber 703 may be adapted to form the metal layer 306 using another metal deposition process, such as a screen printing process, PVD process, or CVD process.

In one embodiment, process chamber 704 is adapted to perform a post-processing step, such as step 210 in FIG. 2A on the flexible base 301. The post processing steps that may be performed during step 210 may be include an anneal step, a clean step, a metrology step or other similar types of processing steps that are commonly performed on after metallizing a surface of the substrate. In one aspect, the process chamber is 704 is adapted to clean the flexible base 301 after performing the one or more processing steps in the prior processing chambers. A typical cleaning step may include a rinse or immersion in a cleaning solution that may contain DI water and/or a cleaning agent to remove metals, particles, or other contamination found on the flexible substrate surface. The cleaning agent may be an acidic or basic solution that may contain hydrofluoric acid (HF), sulfuric acid ($H_2SO_4$), hydrochloric acid (HCl), ammonia ($NH_3$), or other suitable etchant or solvent. In one aspect, an etchant is delivered to the surface of the metallized flexible substrate 320 to remove any excess or unwanted seed layer 305 formed on the surface of the flexible base 301 by use of a conventional wet etch or dry etch process that is adapted to etch the material contained in the seed layer 305.

In another embodiment, the process chamber 704 is adapted to perform a contact isolation process during step 210 to form one or more isolation features 326 in various regions of the formed metallized flexible substrate 320. The isolation features 326, such as isolation features 326A, 326B shown in FIG. 3G, are generally regions where material have been removed from the metallized flexible substrate 320 to isolate and prevent a short circuit from occurring between different regions of the formed solar cell device. In one embodiment, an isolation feature 326A is used to prevent a short between the contacts formed in solar cell device. In another embodiment, an isolation feature 326B is used to prevent a short between different solar cell devices or the contacts formed within different regions of the solar cell device. In one embodiment, the isolation features 326 are formed by a conventional etching technique or laser ablation process.

In another embodiment, the process chamber 704 is adapted to reduce the stress or improve the properties of the deposited metal layers (e.g., metal layers 305, 306, 307). In one embodiment, an annealing step is performed on the solar cell substrate to reduce or even out the intrinsic stress contained in the formed metal layers. In one aspect, the annealing process is performed at a temperature between about 200 and 450° C. in a low partial pressure of nitrogen environment. In one aspect, an anneal process is used to enhance the electrical contact between the formed metal layers and/or the adhesion of the metal layers to the substrate surface, and silicide formation.

Figure 3H:
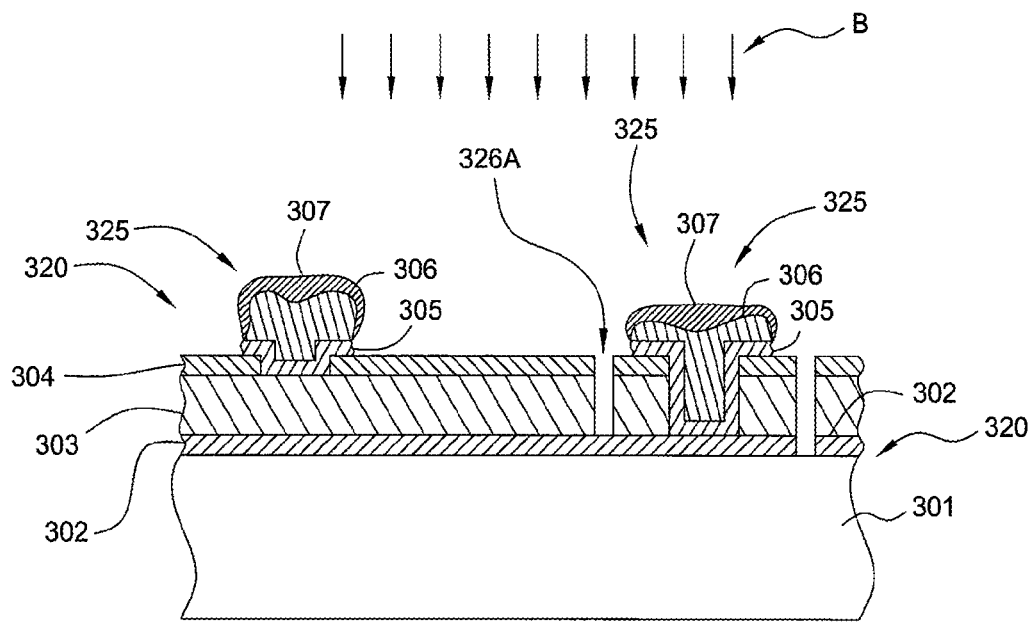
Figure 3I:
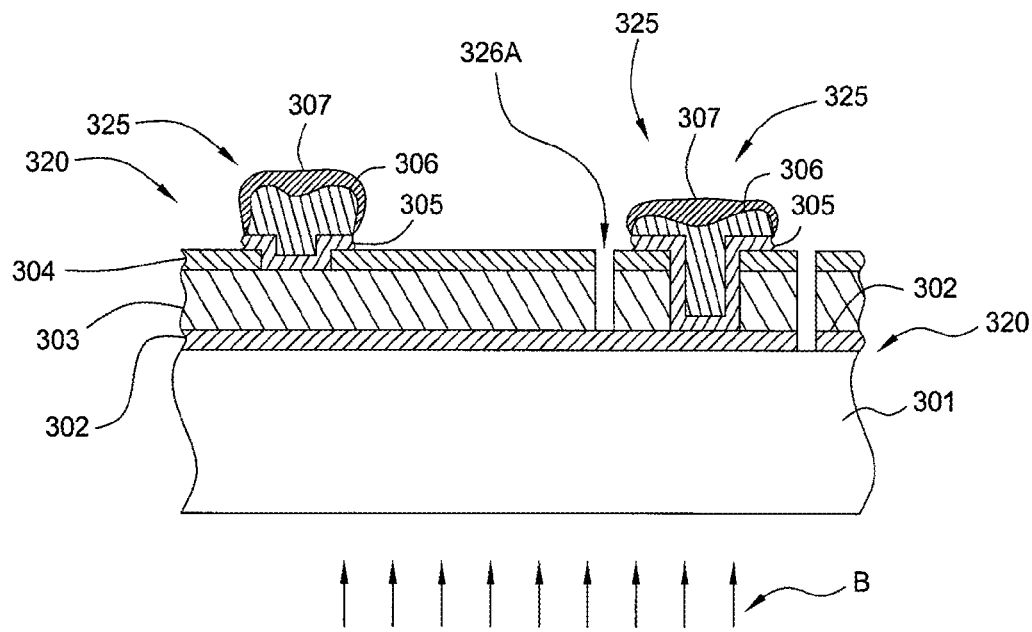

FIGS. 3H and 3I illustrate various embodiments of a metallized flexible substrate 320 that are adapted to receive light "B" from either side of the formed solar cell. FIG. 3H is a side cross-sectional view of a metallized flexible substrate 320 that is adapted to receive light "B" from the side of the substrate that the conductors 325 are formed on. In this case, the active region of the solar device, the layer 303, may be formed from a material, such as polysilicon, cadmium telluride (CdTe), cadmium sulfide (CdS), copper indium gallium selenide (CIGS), copper indium selenide ($CuInSe_2$), or other similar materials. FIG. 3I is a side cross-sectional view of a metallized flexible substrate 320 that is adapted to receive light "B" from the opposite side of the metallized flexible substrate 320 that the conductors 325 are formed on. In this case, the active region of the solar device, the layer 303, may be formed from a material, such as polysilicon, cadmium telluride (CdTe), cadmium sulfide (CdS), copper indium gallium selenide (CIGS), copper indium selenide ($CuInSe_2$), or other similar materials. In this case the backside metal layer 302 is a transparent material that is adapted allow the light "B" to reach the active region of the formed solar cell device. In one embodiment, the backside metal layer 302 is an indium-tin-oxide (ITO) or a transparent conductive oxide (TCO), such as a zinc oxide ($Zn_xO_y$), tin oxide ($Sn_xO_y$), antimony oxide ($Sb_xO_y$), titanium oxide ($Ti_xO_y$), aluminum oxide ($Al_2O_3$), or combination thereof.

Roll-To-Roll Solar Cell Array Formation Process

Figure 8A:
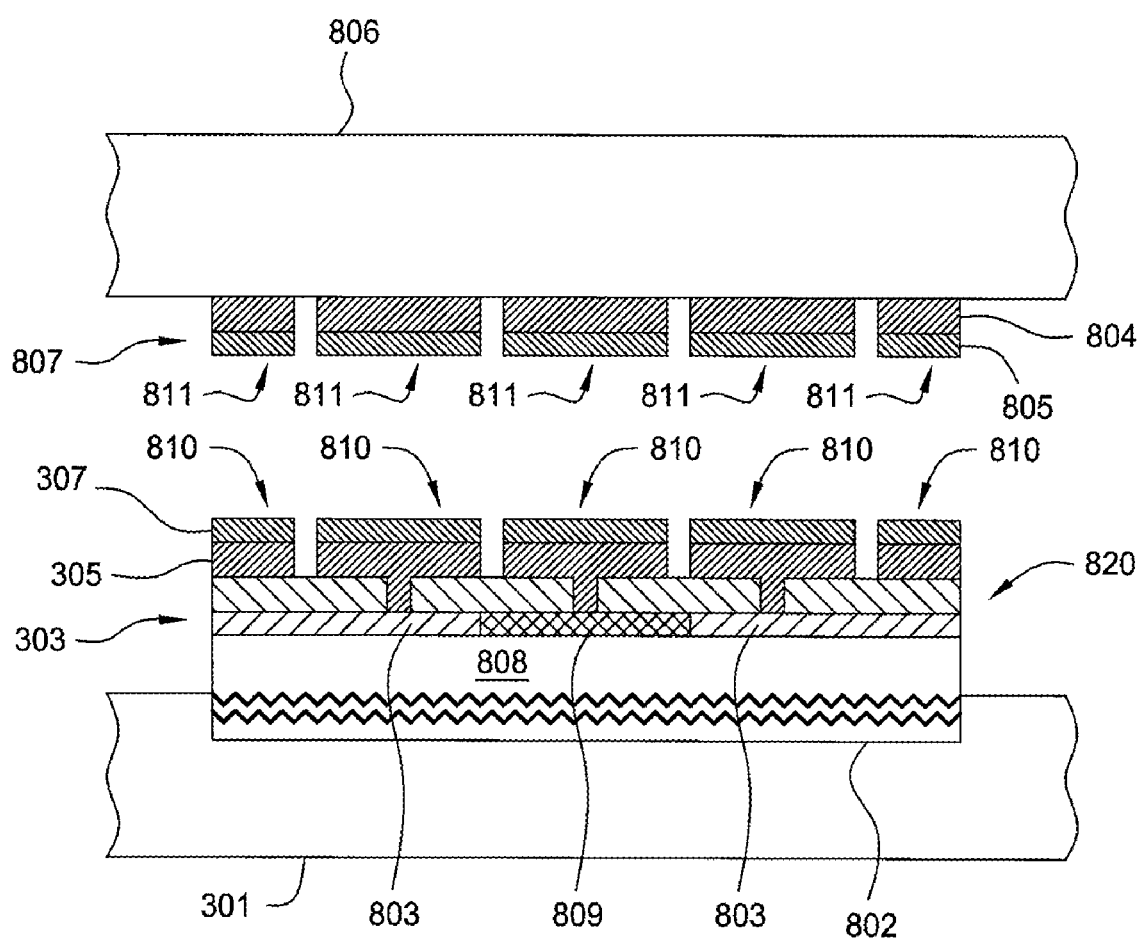
FIG. 8A illustrate schematic cross-sectional views of a metallized substrate and interconnecting element according to one embodiment described herein.
Figure 8B:
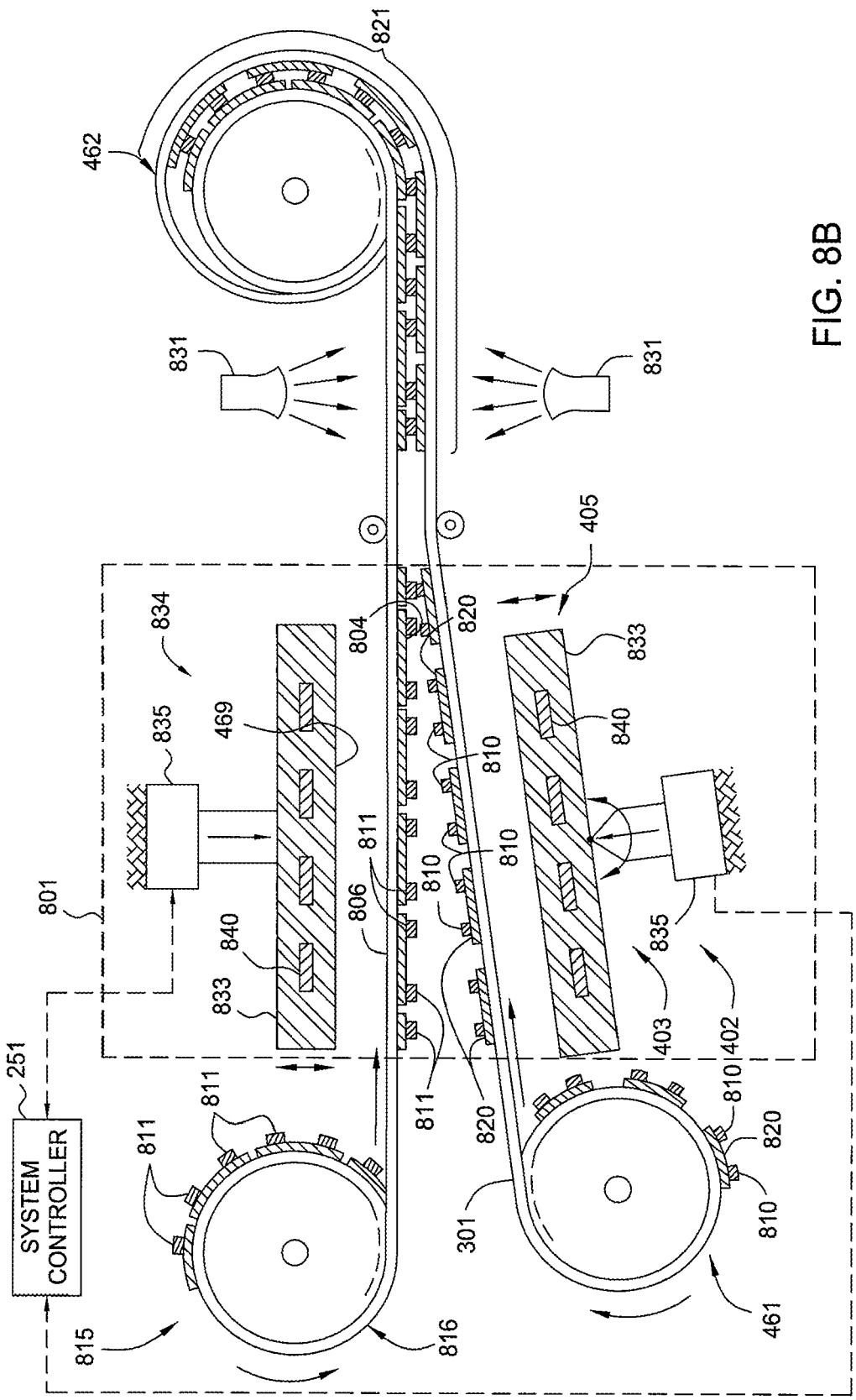
FIG. 8B illustrates isometric side cross-sectional views of an apparatus used to form an interconnected solar cell device according to embodiments described herein.

To form a useful solar cell device it is common to connect multiple solar cells together to form a solar cell array that can deliver a desired voltage and/or current to drive an external load. In one embodiment, solar cell devices formed by use of the method steps 200, or other similar process sequence, are connected together so that they form a solar cell array that is able to convert sunlight directly into usable electrical power. A solar cell array can be connected either in parallel or series depending upon the design objective or design application. FIGS. 8A-8B illustrate an apparatus and method for forming a solar cell array using a flexible solar cell substrate.

FIG. 8A illustrates a side cross-sectional view of a metallized substrate 820 that has been disposed on the flexible base 301, and an interconnecting element 807 that is formed on an opposing flexible base 806. The interconnecting element 807 is generally used to interconnect the solar cell devices formed on the metallized substrate 820. In one embodiment, the metallized substrate 820 comprises a metallized flexible substrate 320 formed on the flexible base 301 following the method steps 200 discussed above. In another embodiment, the metallized substrate 820 is a solar cell substrate that has a base region 802 that has been affixed to the flexible base 301 using an adhesive. In general, the metallized substrates 820 may contain a plurality of electrical contacts 810 that are connected to the active region 303 of a solar cell device. In one embodiment, the electrical contacts 810 have a metal layer 306 and an interface layer 307 that have been formed using the processes described above. In one embodiment of the metallized substrate 820, the active region 303 of the metallized substrate 820 contains a first doped region 809, such as a p$^+$ doped region, that is horizontally positioned next to a second doped region 803, such as an n$^+$ doped region, that are both positioned on a base material 808 that may be an n-type region. While FIG. 8A illustrates a metallized substrate that contains an active region 303 that is oriented horizontally, versus vertically as shown herein (e.g., FIG. 3A-3I), this is not intended to be limiting as to the scope of the invention.

In one embodiment, the interconnecting element 807 generally contains a patterned electrically conductive structure that is formed on the flexible base 806, which can be joined with portions of the metallized substrate 820 to connect desired elements of multiple solar cell devices. The interconnecting element 807 generally contains a plurality of electrical interconnects 811 that are formed on a flexible base 806 using an electroless deposition process, a conventional PVD process or a conventional CVD process, or one or more of the processes described in steps 204-208 above. The pattern or shape of the electrical interconnects 811 is set by the design of the metallized substrate 820 and the interconnect design, and can be formed by following one or more of the patterning techniques discussed above. In one embodiment, the electrical interconnects 811 contain a metal layer 804 and an interface layer 805, where the metal layer 804 may contain a conductive metal, such as a copper, nickel, aluminum, silver, or gold, and the interfacial layer 805 may contain a conductive metal, such as tin, silver, gold, lead, or ruthenium. In one embodiment, two or more of the electrical interconnects 811 formed on the flexible base 806 may be electrically connected together (not shown) so that a solar cell array can be formed when the devices in the metallized substrate 820 are placed in contact with the electrical interconnects 811. The flexible base 806 may be formed from polymeric materials (e.g., polyimide, PET, PEN, silicones, epoxy resin, polyesters), metal foils, thin glass, silicon or other similar materials.

FIG. 8B illustrates a process chamber 801 that is adapted to form a solar cell array by placing one or more of the electrical interconnects 811 in contact with one or more of the electrical contacts 810 formed on the metallized substrate 820 to form an solar cell array 821 that is disposed on the flexible substrates (i.e., flexible bases 301, 806). In one embodiment, the solar cell array 821 may be formed in a roll-to-roll type configuration after the metallized flexible substrate 320 is formed using the method steps 200. In one embodiment, the formation of the electrical connection between the electrical interconnects 811 and the electrical contacts 810 is formed by use of a feed roll 461, a flexible interconnect roll assembly 815, a take-up roll 462, and actuator assembly 402 that are adapted to position and form an electrical connection between the electrical interconnects 811 and the electrical contacts 810. The flexible interconnect roll assembly 815 generally contains an interconnect roll 816 that is adapted to feed the flexible base 806 and electrical interconnects 811 through the process chamber 801 so that the solar cell array 821 can be formed therein and then collected by the take-up roll 462. In one embodiment, the process chamber 801 and flexible interconnect roller assembly 815 are integrated into the roll-to-roll type solar cell formation process sequence after the process chamber 704 illustrated in FIG. 7.

In one embodiment, the formation of the electrical connection between the electrical interconnects 811 and the electrical contacts 810 is completed by positioning one of more of the electrical interconnects 811 over one or more of the electrical contacts 810 by use of a feed roll 461, a flexible interconnect roll assembly 815 and/or a take-up roll 462 and then pressing the electrical interconnects 811 and the electrical contacts 810 together using an actuator assembly 402. The actuator assembly 402 generally contains at least one actuator assembly, such as the first actuator assembly 403 and/or the second actuator assembly 834 that are adapted to urge the electrical interconnects 811 and the electrical contacts 810 together so that an electrical contact can be formed. The first actuator assembly 403 and second actuator assembly 834 may each contain a thrust plate 833 and a mechanical actuator 835 that is used to urge the electrical interconnects 811 and the electrical contacts 810 together.

Forming a good electrical contact between the electrical interconnects 811 and the electrical contacts 810 may be completed due to the addition of heat or force to the contacting surface, which cause the material in the electrical interconnects 811 and the electrical contacts 810 to become electrically, mechanically and/or chemically joined. In one aspect, the thrust plate 833 contains a plurality of heating elements 840 that are connected to the temperature controller (not shown) and a system controller 251 to generate the heat required to cause the material in the electrical interconnects 811 and the electrical contacts 810 to form a good electrical contact when they are pressed together by use of the actuators 835. In one example, the electrical interconnects 811 and the electrical contacts 810 each have a layer on the top surface that contains tin and brought to a temperature between about 175° C. and about 250° C. to form a good electrical contact.

In one embodiment, one or more heat sources 831 are adapted to heat-treat or anneal the electrical interconnects 811 and the electrical contacts 810 to form a reliable and repeatable electrical contact structure. A heat source 831 may be a lamp or IR heating element that is adapted to deliver energy to the electrical interconnects 811 and the electrical contacts 810. In one example, the electrical interconnects 811 and the electrical contacts 810 each have a layer on the top surface that contains tin and brought to a temperature between about 150° C. and about 250° C. to form a good electrical contact.

After forming the solar cell array 821, each of the formed solar cell arrays 821 can be separated from the flexible substrates, or the flexible substrates can be divided up so that the finished solar cell array 821 can be placed into a device that contains the solar cell array.

While the foregoing is directed to embodiments of the present invention, other and further embodiments of the invention may be devised without departing from the basic scope thereof, and the scope thereof is determined by the claims that follow.

What is claimed is:

1. An apparatus for forming a metal layer on a flexible solar cell substrate, comprising:
    a first processing chamber comprising:
        an electrode that is in electrical communication with a power supply;
        a flexible substrate assembly comprising:
            a support that is adapted to retain a portion of a flexible substrate; and
            an actuator that is connected to the support and is adapted to position a metallized surface of the flexible substrate in a desired position proximate to the electrode;
        a contact that is in communication with the power supply; and
        a thrust plate that is adapted to urge the metallized surface of the flexible substrate against the contact; and
    a second processing chamber comprising:
        an actuator that is configured to urge a region of an interconnect roll against a region of the metallized surface, wherein the region of interconnect roll comprises a conductive metal layer; and
        a thrust plate containing at least one heating element that is configured to deliver energy to the regions of the interconnect roll and the metallized surface.

2. The apparatus of claim 1, further comprising a masking plate having a body, a first surface, a second surface and a plurality of apertures that extend through the body between the first surface and the second surface, wherein the thrust plate is further adapted to urge the metallized surface against the first surface of the masking plate, wherein a plurality of electrical contacts are disposed on the first surface and are electrically coupled to a power supply.

3. The apparatus of claim 2, further comprising a pump that is adapted to deliver an electrolyte to space formed between a portion of the metallized surface exposed by the apertures and the electrode.

4. The apparatus of claim 2, wherein the masking plate comprises:
   a first region that is adjacent to the first surface, and comprises a polymeric material; and
   a second region that comprises a material selected from a group consisting of glass, plastic and ceramic.

5. The apparatus of claim 2, wherein the sum of the cross-sectional areas of the apertures at the first surface is between about 0.5% and about 95% of the surface area of the portion of the masking plate that that contacts the metallized layer.

6. The apparatus of claim 2, wherein the sum of the cross-sectional areas of the apertures at the first surface is less than about 30% of the surface area of the portion of the masking plate that that contacts the metallized layer.

7. The apparatus of claim 1, further comprising:
   a first fluid source that is adapted to deliver a copper ion containing electrolyte to the metallized surface and the electrode; and
   a second fluid source that is adapted to deliver a metal ion containing electrolyte to the metallized surface and the electrode, wherein the metal ion is selected from a group consisting of silver, nickel, zinc, or tin.

8. The apparatus of claim 1, further comprising:
   a third processing chamber positioned distance along the flexible substrate from the position proximate to the electrode, and configured to form at least a portion of the metallized surface on a portion of the flexible substrate, wherein the third processing chamber is configured to form the portion of the metallized surface using a process selected from the group consisting of an electroless deposition process, a physical vapor deposition process, a chemical vapor deposition process and an evaporation process.

9. The apparatus of claim 8, further comprising:
   a fourth processing chamber disposed a distance along the flexible substrate from the position proximate to the electrode, wherein the fourth processing chamber comprises a heat source that is adapted to deliver energy to a portion of the formed metal layer.

10. The apparatus of claim 1, wherein the first processing chamber further comprises a flexible masking substrate assembly that comprises:
   a mask support that is adapted to retain a portion of a flexible masking substrate that has a plurality of apertures formed therein; and
   an actuator that is configured to move the flexible masking substrate relative to the metallized surface of the flexible substrate.

* * * * *

UNITED STATES PATENT AND TRADEMARK OFFICE
CERTIFICATE OF CORRECTION

PATENT NO. : 7,799,182 B2
APPLICATION NO. : 11/566200
DATED : September 21, 2010
INVENTOR(S) : Lopatin et al.

Page 1 of 1

It is certified that error appears in the above-identified patent and that said Letters Patent is hereby corrected as shown below:

In the Detailed Description:

Column 14, Line 53, please delete "($CuSO_4.5(H_2O)$)" and insert --($CuSO•5(H_2O)$)-- therefor;

Column 15, Line 8, please delete "($CuSO_4.5(H_2O)$)" and insert --($CuSO_4•5(H_2O)$)-- therefor;

Column 15, Line 11, please delete "($C_7H_5O_6SNa.2H_2O$)" and insert --($C_7H_5O_6SNa•2H_2O$)-- therefor;

Column 15, Line 20, please delete "($CuSO_4.5(H_2O)$)" and insert --($CuSO_4•5(H_2O)$)-- therefor;

Column 15, Line 22, please delete "($Na_4P_2O_7.10(H_2O)$)" and insert --($Na_4P_2O_7•10(H_2O)$)-- therefor;

Column 16, Line 44, please delete "($SnSO_4.5(H_2O)$)" and insert --($SnSO_4•5(H_2O)$)-- therefor.

Signed and Sealed this
First Day of February, 2011

David J. Kappos
*Director of the United States Patent and Trademark Office*